(12) United States Patent
Kawamura et al.

(10) Patent No.: US 6,919,158 B2
(45) Date of Patent: Jul. 19, 2005

(54) CONDUCTIVE PATTERN MATERIAL AND METHOD FOR FORMING CONDUCTIVE PATTERN

(75) Inventors: Koichi Kawamura, Shizuoka-ken (JP);
Sumiaki Yamasaki, Shizuoka-ken (JP);
Takao Nakayama, Shizuoka-ken (JP);
Takeyoshi Kano, Shizuoka-ken (JP);
Miki Takahashi, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 92 days.

(21) Appl. No.: 10/208,820

(22) Filed: Aug. 1, 2002

(65) Prior Publication Data

US 2003/0068581 A1 Apr. 10, 2003

(30) Foreign Application Priority Data

| Aug. 3, 2001 | (JP) | 2001-236893 |
| Sep. 4, 2001 | (JP) | 2001-267054 |
| Dec. 19, 2001 | (JP) | 2001-386491 |
| Dec. 27, 2001 | (JP) | 2001-398048 |
| May 28, 2002 | (JP) | 2002-154289 |

(51) Int. Cl.$^7$ ................................................. G03F 7/00
(52) U.S. Cl. .................... 430/270.1; 430/291; 430/311; 430/315; 430/330; 430/417; 430/524; 430/530
(58) Field of Search .............................. 430/315, 311, 430/270.1, 291, 417, 524, 530

(56) References Cited

U.S. PATENT DOCUMENTS

2003/0008223 A1 * 1/2003 Kawamura et al. ............ 430/7

* cited by examiner

*Primary Examiner*—Yvette C. Thornton
(74) *Attorney, Agent, or Firm*—Burns, Doane, Swecker & Mathis, LLP

(57) ABSTRACT

There are provided a conductive pattern material and a pattern-forming method by which a fine pattern having a high resolution and no wire breakage is obtained. The conductive pattern material is such that on a support surface a pattern-forming layer is formed which allows the formation of a hydrophilic/hydrophobic region directly bonded to the support surface due to energy imparted. Energy is imparted to the pattern-forming material in an imagewise manner to form the conductive material layer.

12 Claims, 1 Drawing Sheet

CONDUCTIVE PATTERN MATERIAL AND METHOD FOR FORMING CONDUCTIVE PATTERN

BACKGROUND OF THE INVENTION

1. Field of the Invention

The present invention relates to a pattern-forming material and a pattern-forming method, and particularly to a conductive pattern-forming material by which a fine conductive pattern can be readily formed and which is useful for forming a fine wiring substrate, and to a method for forming a pattern using the conductive pattern-forming material.

2. Description of the Related Art

Conventionally, various conductive pattern-forming materials have been used for formation of wiring substrates and the like. A typical pattern-forming method is one in which thin film conductive material formed by a well-known method such as vacuum deposition is provided on an insulator and subjected to resist treatment. A portion of the previously-prepared resist is removed by pattern exposure, and thereafter, subjected to etching to form a desired pattern. This method requires at least four processes. When wet etching is carried out, a process for the disposal of waste liquid is additionally required. Therefore, the aforementioned method is inevitably complicated.

Further, there is also another known pattern-forming method in which a conductive pattern-forming material uses photoresist. This is a method in which a base material coated with photoresist polymer or having dry film-shaped photoresist applied thereon is subjected to UV exposure via an arbitrary photo mask to form a lattice-type pattern or the like. This method is useful for the formation of an electromagnetic-wave shield as it requires a high conductivity.

With advances in the development of micro-machines, and with super LSIs being made even smaller in recent years, the very fine wiring structure of a nano-scale has come to be demanded. There is a limit to making microstructures by conventional metal etching, and there is a fear of the thin-line portion being broken during processing. For this reason, a method using a functional organic molecular thin film has been proposed in order to form an orientation-controlled fine pattern. However, in this method as well, imagewise writing is carried out by UV exposure using a conventional mask such as a lithographic film, and so, the degree of freedom in the formation of circuits is not very high.

Recently a new method has been given attention where a liquid material is supplied onto a substrate and a pattern is directly formed thereon. This method is used for the production of organic transistors. They are produced as follows. First, a separator of polyimide is formed on an insulating substrate using photolithography, and the surface is subjected to water repellent finishing using plasma processing. Subsequently, a conductive high polymer solution for forming a source electrode and a drain electrode is supplied by an ink jet device in an imagewise manner to thereby form the electrodes. Thereafter, a semiconductor layer material and an insulating layer material are sequentially spin coated to form a semiconductor layer and an insulating layer. Finally, a gate electrode is formed by an ink jet device in an imagewise manner.

Such a production method of organic transistors is also disclosed in, for example, Japanese Patent Application Laid-Open (JP-A) Nos. 11-204529, 11-207959 and 2000-208774. This method has the advantage that no large-scale apparatus such as a vacuum evaporator is required for the formation of electrodes. However, regions for isolating electrodes formed adjacently is carried out by conventional photolithography. This restricts the accuracy of electrode formation. The complicatedness of the photolithographic process has not been solved.

In recent years, a method using a conductive pattern-forming material has been given attention where a pattern is formed directly from digitized data without a mask. Various pattern-forming methods have been proposed.

Such a method for forming a digitized pattern can be expected to result in a fine pattern arbitrarily formed. One such method uses a self-organizing monomolecular film. This method uses a molecular aggregate which is spontaneously formed when a substrate is immersed in an organic solvent containing a surface active molecule. By employing a molecular aggregate such as a combination of an organic silane compound and $SiO_2$, $Al_2O_3$ or a substrate, or a combination of alcohol or amine and a platinum substrate, the formation of a pattern by photolithography is made possible. Although this monomolecular film enables the formation of a fine pattern, it necessitates the used limited combination of substrate and material. Therefore, bringing the development of the method to practical application is difficult, and so under the existing circumstances, a pattern-forming technique for fine wiring which is suitable for practical use has not yet been established.

SUMMARY OF THE INVENTION

In view of the aforementioned drawbacks in the conventional art, an object of the present invention is to provide a conductive pattern material having wide application, that allows the formation of a high-resolution fine pattern at high sensitivity due to exposure or heating with no wire breakage, and the formation of circuits directly on the base material based on the digital data from the operation of an infrared laser. Another object of the present invention is to provide a conductive pattern-forming material which is suitable for formation of a material requiring a high conductivity and arbitrary pattern formation, such as an electromagnetic-wave shield, and a method for forming a pattern using the conductive pattern-forming material.

One more object of the present invention is to provide a pattern-forming method having wide applications without recourse to complicated processes or expensive apparatus, in which pattern formation is made possible at a high sensitivity due to exposure or heating, and a high-resolution fine pattern is obtained even when the method applied to the formation of wiring or the like uses different materials. Further, an object is to provide a pattern-forming method where a pattern can be directly formed on a substrate based on digital data from the operation of a laser or the like.

As a result of diligent studies, the present inventors have found that the aforementioned objects of the present invention can be achieved by using a conductive material and a high molecular compound having a functional group which causes polarity conversion due to exposure, heating, or irradiation by an infrared laser. Therefore, they have carried out and completed the present invention.

In other words, the conductive pattern material of the present invention is characterized by that a pattern-forming material has, on a support surface, a pattern-forming layer which allows formation of a hydrophilic/hydrophobic region directly bonded to the support surface due to energy imparted, and energy is imparted to the pattern-forming material in an imagewise manner to allow the hydrophilic/hydrophobic region to be formed on the surface of the pattern-forming material, and thereafter, a conductive material layer is formed on the imagewise hydrophilic/hydrophobic region.

One aspect is that the pattern-forming material used herein has a structure in which a high molecular compound-containing layer is provided on the support. A high molecular compound having a functional group changing between the hydrophilic and hydrophobic properties due to heat, an acid, or radiation is directly bonded to the surface of the support to form the layer. The high molecular compound preferably has a functional group changing between the hydrophilic and hydrophobic properties at a side chain. It is preferably a surface graft polymer directly bonded to the surface of the support,—a straight-chain high molecular compound bonded directly to the surface of the support at an end of a high polymer chain by a covalent bond, or a straight-chain high molecular compound bonded by a covalent bond to the surface of the support via a truncated high molecular compound at an end of a high polymer chain.

Another aspect of the pattern-forming material is that it has a structure in which the pattern-forming material is used to form a hydrophilic pattern in such a manner that a hydrophilic compound having a polymeric group is made to contact the support, and is directly bonded to the support surface due to imagewise irradiation of radiation.

Moreover, conductive particles are the preferable conductive material for forming the conductive material layer. The conductive material is preferably adhered by adsorption to a previously-formed patterned portion having the hydrophilic or hydrophobic property.

The present inventors have also found that the aforementioned objects of the present invention can be achieved by using a high molecular compound having a functional group which causes polarity conversion due to exposure, heating, or irradiation by an infrared laser, and locally adsorbing a fluid to a region in which the polarity is converted. For these reasons also they have carried out and completed the present invention.

In other words, the pattern-forming method of the present invention comprises the steps of: providing, on a support, a high molecular compound-containing layer having a functional group which changes from a hydrophobic property to a hydrophilic property due to heat, an acid, or radiation, to thereby form a pattern-forming material; effecting one of heating, supplying of an acid, and irradiation of radiation for the pattern-forming material in an imagewise manner to change the layer from the hydrophobic property to the hydrophilic property, thereby forming an acceptor pattern; and forming an adsorption layer by locally applying a fluid having an affinity with the acceptor pattern onto the imagewise acceptor pattern, and making the fluid to be adsorbed thereto.

The high molecular compound having a functional group changing between the hydrophilic and hydrophobic properties due to heat, an acid, or radiation, is preferably a high molecular compound having, at the side chain, a functional group changing between the hydrophilic and hydrophobic properties due to heat, an acid, or radiation. The aforementioned high molecular compound is preferably a surface graft polymer directly bonded to the support,—a straight-chain high molecular compound bonded directly to the surface of the support at an end of a high polymer chain by a covalent bond, or a straight-chain high molecular compound bonded by a covalent bond to the surface of the support via a truncated high molecular compound at an end of a high polymer chain.

In the present invention, it is preferable to use a method in which the fluid is discharged from a nozzle hole of an ink-jet recording head to apply it onto the acceptor pattern. This is from the standpoint of improving the pattern-forming accuracy.

The conductive pattern-forming method of the present invention comprises the steps of: providing, on a support, a high molecular compound-containing layer in which a high molecular compound having a functional group which changes from a hydrophobic property to a hydrophilic property due to heat, an acid, or radiation, is directly bonded to the support surface to thereby form a pattern-forming material; forming a pattern by effecting one of heating, supplying of an acid, and irradiation with radiation, for the pattern-forming material in an imagewise manner to change the layer from the hydrophobic property to the hydrophilic property; and introducing a conductive material in the imagewise hydrophilic pattern to form a conductive material layer.

Further, the conductive pattern-forming method of the present invention comprises the steps of: forming, on a support, a hydrophilic pattern in such a manner that a hydrophilic compound having a polymeric group is made to contact the support and is directly bonded to the support surface due to imagewise irradiation of radiation; and forming a conductive material layer by introducing a conductive material in the hydrophilic pattern.

Concerning the first aspect described above, pattern formation is carried out by allowing conductive particles to be selectively adsorbed to a region to which energy, irradiation of radiation—such as heating or exposure inclusive—is imparted. Adsorption takes place in accordance with the surface polarity of a high molecular compound having a functional group which changes between the hydrophilic and hydrophobic properties due to heat, an acid, or radiation (hereinafter, where appropriate, referred to as a polarity conversion group). Therefore, a high-resolution pattern based on digital data can be obtained. Similarly, in the second aspect, a hydrophilic pattern is formed by making a hydrophilic compound having a polymeric group contact the surface of the support, irradiating the surface with radiation in an imagewise manner to produce an active site on the surface of the support, and binding the compound having a polymeric group thereto. A high-resolution pattern can then be obtained in accordance with the pattern obtained by exposure or heating imparted.

The high molecular compound having a polarity conversion group used as the pattern-forming layer of the conductive pattern-forming material is, for example, bonded directly or via a truncated high molecular compound to the support at the end thereof. Further, the hydrophilic compound used in the second aspect is directly bonded to the support by exposure or the like. Moreover, conductive particles used for forming wiring are fixedly adsorbed to the surface of the hydrophilic/hydrophobic region of the pattern-forming layer like an ionic bond in accordance with the polarity. Therefore, the portion in which the conductive region is formed exhibits high strength and wear resistance. As a result, a high strength wiring pattern can be formed even though it has a thin-layer structure. The conductive particles are adsorbed in ionic fashion to the polarity conversion group, and adsorbed molecules are fixed in a stable way in a state approximating that of a monomolecular film.

Therefore, it is conceivable that a fine wiring pattern having a thin-layer structure with no wire breakage can be formed.

In the pattern-forming method of the invention, an acceptor pattern for a fluid to be selectively introduced in a heated region or one which is irradiated with radiation (including exposure), is formed on the surface of a high molecular compound having a functional group, which changes between the hydrophilic and hydrophobic properties due to heat, an acid, or radiation (hereinafter occasionally referred to as a polarity conversion group), in accordance with the surface polarity of the high molecular compound. The fluid is locally adsorbed thereto to thereby form an adsorption layer. Therefore, a high-resolution pattern based on digital data can be obtained.

The high molecular compound having a polarity conversion group used for the high molecular compound-containing layer of the conductive pattern-forming material is, for example, bonded directly or via a truncated high molecular compound to the support at the end thereof. The fluid is fixedly adsorbed thereto like an ionic bond in accordance with the polarity. Therefore, the portion in which the adsorption layer is formed exhibits high strength and wear resistance. Further, the fluid is adsorbed to the acceptor pattern using a device for locally supplying the fluid,—an ink-jet device, a plotter, or the like. Therefore, the desired effect can be simply achieved using a smaller amount of fluid than that used in the immersion method or the like. Further, the fluid is locally supplied and different patterns are independently formed, so they do not physically or chemically affect one another even if a number of different kinds is used. Therefore, the present method can suitably be used in order to sequentially form different electrode patterns, such as in the production of TFT.

Furthermore, in the present invention, the polarity conversion group has the ability of adsorbing conductive particles, or again, the hydrophilic functional group has a graft chain structure having a high mobility. Therefore, compared with the general case in which conductive particles are adsorbed to a common crosslinking high-molecular film, the rate of adsorption is extremely high and the amount of conductive particles adsorbed per unit area increases. Accordingly, there is no possibility of conductivity being hindered due to a gap formed between the fine grains. Therefore, a higher sensitivity can be realized in the conductive pattern-forming material of the invention by decreasing the layer thickness of the pattern-forming layer while maintaining the efficiency in forming fine wiring. Further, a high molecular compound for forming the pattern-forming layer is directly chemically bonded to a support, thereby resulting in excellent durability in a thin-layer structure.

Further, a conductive pattern-forming method according to another aspect of the present invention comprises the steps of forming, on a support, a hydrophilic pattern directly bonded to a surface of the support, and making the hydrophilic pattern to adsorb and polymerize a conductive monomer to form a conductive polymer layer.

A method which is particularly useful in forming the hydrophilic pattern is as follows:

(A) a method in which a hydrophilic compound having a polymeric group is made to contact a support and irradiated with radiation in an imagewise manner to form a hydrophilic pattern; and (B) a method in which a hydrophilic pattern is formed by providing, on a support, a high molecular compound-containing layer having a functional group which changes between hydrophobic and hydrophilic properties due to heat, an acid, or radiation, and by effecting one of heating, supplying of an acid, and irradiation of radiation for the layer in an imagewise manner to change the layer between the hydrophobic and hydrophilic properties.

Further the present inventors have found that the aforementioned objects of the present invention can be achieved by a simple process in which a metal ion or a metallic salt is applied to a portion of a hydrophilic region of a pattern formed on a surface of a substrate and comprised of a hydrophilic/hydrophobic region, and thereafter, the metal ion or a metal ion in the metallic salt is reduced.

DESCRIPTION OF THE PREFERRED EMBODIMENTS

Figure 1:
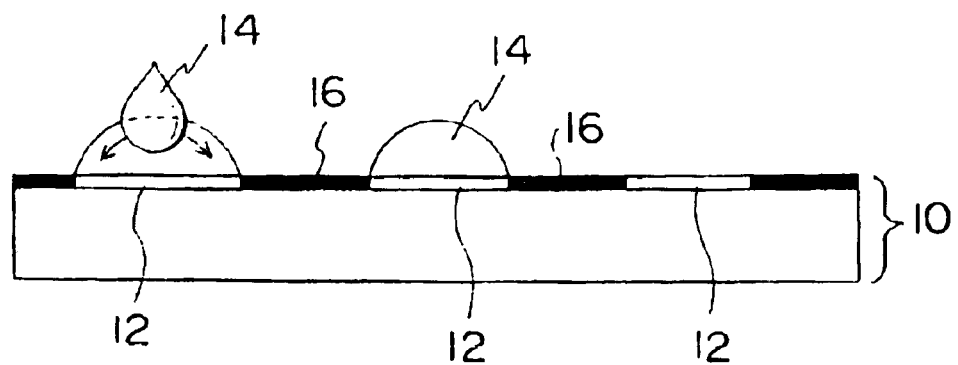
FIG. 1 is a model diagram showing the behavior of a fluid supplied in the vicinity of a pattern acceptor.

A conductive pattern-forming material of the present invention will be hereinafter described in detail.

First, description will be given of a means for forming a pattern-forming layer in which an end of a high polymer chain, which has a functional group that changes between hydrophilic and hydrophobic properties is chemically bonded to a support surface, directly or via a truncated high polymer. This is a characteristic of a conductive pattern-forming material according to a first embodiment of the present invention.

Surface Graft Polymerization

According to the first embodiment of the invention, the pattern-forming layer is generally prepared using a means called surface graft polymerization. Graft polymerization is a method in which active species are given to a high molecular compound chain, and another monomer which starts polymerization is thereupon polymerized to make possible synthesis of a graft polymer. Particularly, surface graft polymerization is a method in which a high molecular compound giving active species forms a solid surface.

Any known methods disclosed in various documents can be used for the surface graft polymerization method for actualizing the invention. For example, photo-graft polymerization and plasma-irradiation graft polymerization are described as the surface graft polymerization in "Shin Kobunshi Jikkengaku 10" (edited by Kobunshi Gakkai, published by Kyoritsu Shuppan Kabushiki-kaisha, 1994, p. 135). Further, a radiation-exposure graft polymerization method using a gamma ray or electron beam is described in "Kyuchaku Gijutsu Binran" (edited by Takeuchi, published by NTS, February 1999, pp. 203 and 695).

Specific methods for photo graft polymerization that are disclosed in JP-A Nos. 10-296895 and 11-119413 can be used.

In order to prepare a surface graft layer to which an end of a high molecular compound chain is directly chemically bonded, a reactive functional group such as a trialkoxysilyl group, an isocyanate group, an amino group, a hydroxyl group or a carboxyl group is given to an end of a high polymer compound chain, and the reactive functional group is made to conduct a coupling reaction with a functional group existing on the support surface. This forms the surface graft layer.

The support surface mentioned in the invention means a surface having the function of causing the end of a high molecular compound having a polarity conversion group to be chemically bonded directly or via a truncated high molecular compound to it. The support itself may have such bonding characteristics or the support may include an intermediate layer provided thereon that has such characteristics.

Further, in order to prepare a surface to which the end of a high molecular compound chain having a polarity conversion group is chemically bonded via a truncated high molecular compound, a functional group capable of conducting a coupling reaction with a functional group on the support surface is given to a side chain of the truncated high molecular compound. A graft high molecular compound, in which a high molecular compound chain has a functional group which changes between hydrophilic and hydrophobic properties is built in as the graft chain is synthesized, and the high polymer and the functional group on the surface of a lower layer are made to conduct a coupling reaction.

Functional Group that Changes Between Hydrophilic and Hydrophobic Properties

Next, a description will be given of one of the features of a planographic printing plate precursor according to the invention, which is, functional groups (polarity conversion groups) that change between hydrophilic and hydrophobic properties due to heat, acids, or radiation.

The polarity conversion group includes two types of functional groups: a functional group that changes from the hydrophobic to the hydrophilic property, and a functional group that changes from the hydrophilic to the hydrophobic property.

Functional Group that Changes from the Hydrophobic Property to the Hydrophilic Property For functional groups that change from the hydrophobic to the hydrophilic property, publicly-known functional groups disclosed in various documents can be used.

Useful examples of such functional groups include alkyl sulfonate, disulfone, sulfonimide disclosed in JP-A No. 10-282672, alkoxyalkyl ester disclosed in European Patent No. 0652483 and PCT International Publication No. WO92/9934, t-butyl ester disclosed in "Macromolecules" vol. 21, p. 1477, by H. Ito et al.), and calboxylic acid ester protected by an acid-decomposable group, such as silyl ester or vinyl ester disclosed in other documents.

Further, documents are an iminosulfonate group disclosed in "Surface" vol. 133 (1995), p. 374 by Masahiro Tsunooka, β ketone sulfonate esters disclosed in "Polymer preprints", Japan, vol. 46 (1997), p. 2045 by Masahiro Tsunooka, and nitrobenzyl sulfonate compound disclosed in JP-A No. 63-257750, by Tsuguo Yamaoka, can be used. However, the present invention is not limited to these functional groups.

Among them, a secondary alkyl sulfonate group represented by the formula indicated below, a tertiary calboxylic acid ester group, and an alkoxyalkyl ester group also described below, are particularly preferable.

The secondary alkyl sulfonate group, particularly excellent as the functional group changing from the hydrophobic to the hydrophilic property in the invention, is represented by the following general formula (1).

General formula (1)

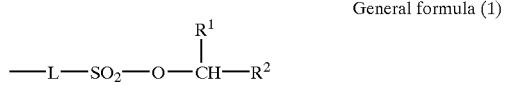

In the general formula (1), L represents an organic group constituted of a polyvalent non-metal atom required for connection to a polymer skeleton, and $R^1$ and $R^2$ each represent a substituted or non-substituted alkyl group. Further, $R^1$ and $R^2$ are bonded with a secondary carbon atom (CH), and may be made to form a ring with it.

$R^1$ and $R^2$ in the general formula (1) each represent a substituted or non-substituted alkyl group, or a substituted or non-substituted aryl group, and bonded with a secondary carbon atom (CH), may be made to form a ring with it. When $R^1$ and $R^2$ each represent a substituted or non-substituted alkyl group, a methyl group, an ethyl group, an isopropyl group, t-butyl group or cyclohexyl group is used as a straight chain, branched, or cyclic alkyl group. An alkyl group having 1 to 25 carbon atoms is preferably used. When $R^1$ and $R^2$ each represent a substituted or non-substituted aryl group, the aryl group is to include a carbocyclic aryl group and a heterocyclic aryl group. Examples of a carbocyclic aryl group include a phenyl group, a naphthyl group, an anthracenyl group and a pyrenyl group, each having 6 to 19 carbon atoms. Further examples of the heterocyclic aryl group include a pyridyl group, a furyl group, a quinolyl group with a benzene ring condensed, a benzofuryl group, a thioxanthone group and a carbazole group, each having 3 to 20 carbon atoms and 1 to 5 hetero atoms.

When $R^1$ and $R^2$ represent a substituted alkyl group and a substituted aryl group, the following groups can be used as a substituent. An alkoxy group having 1 to 10 carbon atoms, such as a methoxy group or an ethoxy group; a halogen atom such as fluorine atom, chlorine atom or bromine atom; a halogen-substituted alkyl group such as a trifluoromethyl group or trichloromethyl group; an alkoxycarbonyl group or an aryloxycarbonyl group having 2 to 15 carbon atoms, such as a methoxycarbonyl group, an ethoxycarbonyl group, t-butyloxycarbonyl group or p-chlorophenyloxycarbonyl group; a hydroxyl group; an acyloxy group such as acetyloxy, benzoyloxy or p-diphenylaminobenzoyloxy; a carbonate group such as t-butyloxycarbonyloxy group; an ether group such as t-butyloxycarbonylmethyloxy group or 2-pyranyloxy group; a substituted or non-substituted amino group such as amino group, dimethylamino group, diphenylamino group, morpholino group or acetylamino group; a thioether group such as methyl thio group or phenyl thio group; an alkenyl group such as a vinyl group or a steryl group; a nitro group; a cyano group; an acyl group such as formyl group, acetyl group or benzoyl group; an aryl group such as a phenyl group or a naphthyl group; and a hetero aryl group such as pyridyl group. Further, when $R^1$ and $R^2$ each represent a substituted aryl group, a substituent may also be an alkyl group, such as a methyl group or an ethyl group, in addition to the aforementioned examples.

The aforementioned $R^1$ and $R^2$ are from the standpoint of excellent preservation stability of photosensitive material preferably substituted or non-substituted alkyl groups. Among them, an alkyl group substituted with an electron attracting group such as an alkoxy group, carbonyl group, alkoxycarbonyl group, cyano group or halogen group; or an alkyl group such as a cyclohexyl group or norbornyl group are particularly preferable from the standpoint of stability with the passage of time. From the standpoint of physical properties, a compound in which a chemical shift of secondary methine hydrogen at proton NMR in dense chloroform appears in a magnetic field lower than 4.4 ppm is preferable, and a compound in which it appears in a magnetic field lower than 4.6 ppm is more preferable. An alkyl group substituted with an electron attracting group is considered particularly preferable for the reason that carbocation, which is considered to be generated as an intermediate at the time of thermal decomposition reaction, is made unstable due to the electron attracting group, restraining the decomposition. Specifically, the —$CHR^1R^2$ structures represented by the following formulae are particularly preferable.

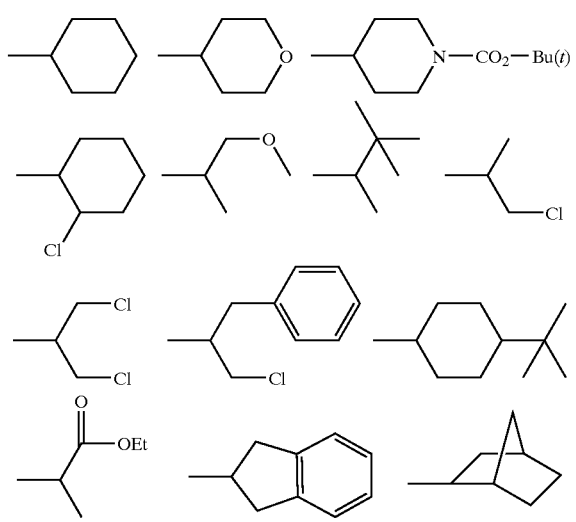

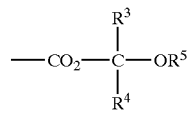

Further, a polyvalent coupling group comprised of non-metallic atoms represented by L in the aforementioned general formula (1) is constituted of 1 to 60 carbon atoms, 0 to 10 nitrogen atoms, 0 to 50 oxygen atoms, 1 to 100 hydrogen atoms and 0 to 20 sulfur atoms. A more specific example of the coupling group is one in which structural units shown below are combined.

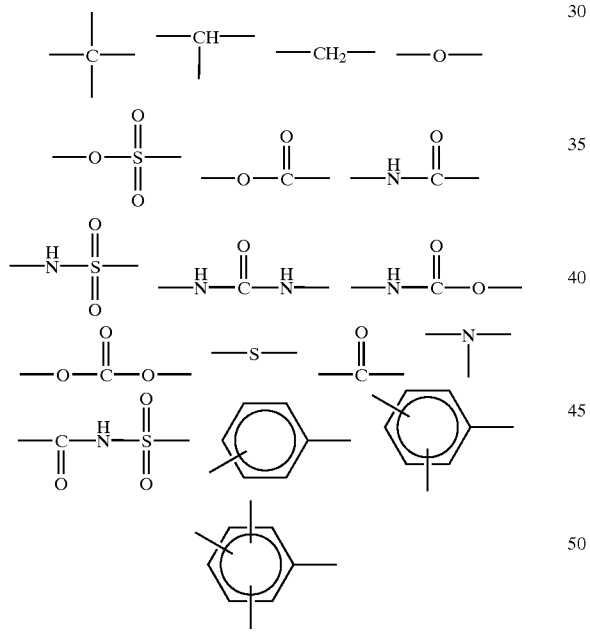

polyvalent naphthalene, polyvalent anthracene

When the polyvalent coupling group has a substituent, examples of the substituent include an alkyl group having 1 to 20 carbon atoms, such as a methyl group or an ethyl group; an aryl group having 6 to 16 carbon atoms, such as a phenyl group or a naphthyl group; an acyloxy group having 1 to 6 carbon atoms, such as a hydroxyl group, a carboxyl group, a sulfonamide group, an N-sulfonylamide group or an acetoxy group; an alkoxy group having 1 to 6 carbon atoms, such as a methoxy group or an ethoxy group; a halogen atom such as chlorine or bromine; an alkoxycarbonyl group having 2 to 7 carbon atoms, such as a methoxycarbonyl group, an ethoxycarbonyl group or a cyclo-hexyloxycarbonyl group; a carbonic ester group such as a cyano group or a t-butylcarbonate, and the like.

In the invention, an alkoxy alkyl ester group particularly excellent as a functional group changing from the hydrophobic property to the hydrophilic property, is represented by the following General formula (2).

$$-CO_2-\underset{R^4}{\overset{R^3}{\underset{|}{C}}}-OR^5$$

In the aforementioned formula, $R^3$ represents a hydrogen atom, $R^4$ represents a hydrogen atom or an alkyl group not having more than 18 carbon atoms, and $R^5$ represents an alkyl group not having more than 18 carbon atoms. Further, two of $R^3$, $R^4$ and $R^5$ may be bonded to form a ring. Particularly, $R^4$ and $R^5$ may preferably be bonded to form a 5- or 6-membered ring.

The secondary alkyl sulfonate group represented by the general formula (1) is particularly preferable for the functional group changing from the hydrophobic to the hydrophilic property in the invention.

Specific examples of the functional groups represented by the aforementioned general formulae (1) and (2), that is, functional groups (1) to (13) are shown below.

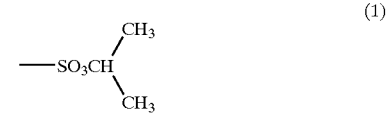

(1)

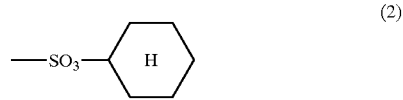

(2)

(3)

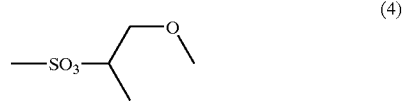

(4)

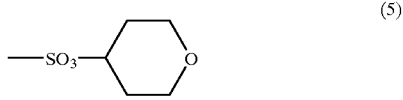

(5)

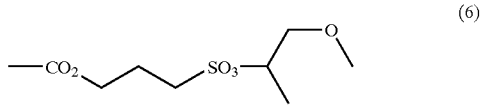

(6)

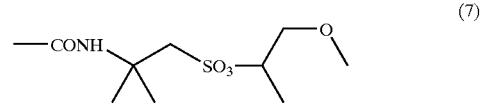

(7)

(8)

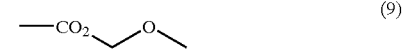

(9)

-continued

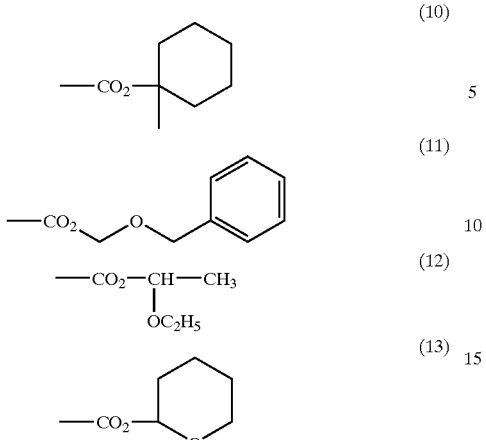

Functional Groups that Changes from the Hydrophilic Property to the Hydrophobic Property:

In the invention, publicly-known functional groups, for example, a polymer containing onium salt group, and particularly, a polymer containing ammonium salt as disclosed in JP-A No. 10-296895 and U.S. Pat. No. 6,190,830, can be used for the functional groups that change from the hydrophilic property to the hydrophobic property due to heat, an acid, or radiation,. Specific examples thereof include (meth)acryloyloxyalkyltrimethylammonium and the like. Other suitable examples include a carboxylic acid group and a carboxylate group represented by the following general formula (3). The invention is not particularly limited to these examples.

General Formula (3)

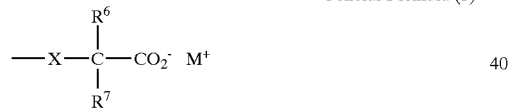

wherein X represents —O—, —S—, —Se—, —NR$^8$—, —CO—, —SO—, —SO$_2$—, —PO—, —SiR$^8$R$^9$—, —CS—. R$^6$, R$^7$, R$^8$ and R$^9$ each independently represent a monovalent group, and M represents an ion having a positive charge.

Specific examples of R$^6$, R$^7$, R$^8$ and R$^9$ include —F, —Cl, —Br, —I, —CN, —R$^{10}$, —OR$^{10}$, —OCOR$^{10}$, —OCOOR$^{10}$, —OCONR$^{10}$R$^{11}$, —OSO$_2$R$^{10}$, —COR$^{10}$, —COOR$^{10}$, —CONR$^{10}$R$^{14}$, —NR$^{10}$R$^{11}$, —NR$^{10}$—COR$^{11}$, —NR$^{10}$—COOR$^{11}$, —NR$^{10}$—CONR$^{11}$R$^{12}$, —SR$^{10}$, —SOR$^{10}$, —SO$_2$R$^{10}$, —SO$_3$R$^{10}$ and the like.

R$^{10}$, R$^{11}$ and R$^{12}$ each represent a hydrogen atom, an alkyl group, an aryl group, an alkenyl group or an alkynyl group.

Among these groups, R$^6$, R$^7$, R$^8$ and R$^9$ are each preferably a hydrogen atom, an alkyl group, an aryl group, an alkynyl group or an alkenyl group.

A specific example of M is an ion having a positive charge as described above.

Specific examples of functional groups represented by the aforementioned general formula (3) [functional groups (14) to (31)] are described below.

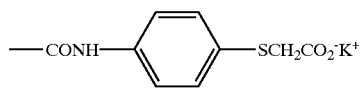
(31)

In the invention, the high molecular compound having a polarity conversion group may be a homopolymer comprised of one kind of monomer having such a functional group as described above, or it may be a copolymer comprised of two or more kinds of monomers. Further, a copolymer comprised of other monomers may also be used so long as the efficacy of the invention is not impaired.

Specific examples of monomers having the aforementioned functional groups will be shown below.

Specific examples M-1 to M-15 of monomers having the functional groups represented by the general formulae (1) and (2):

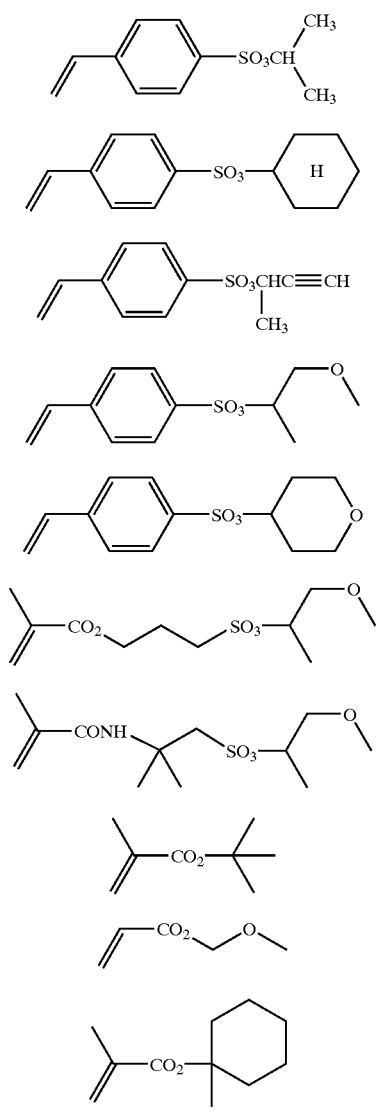

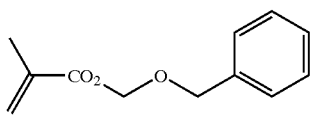
M-11

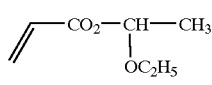
M-12

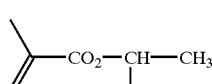
M-13

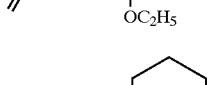
M-14

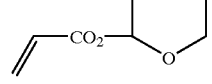
M-15

Specific examples M-16 to M-33 of monomers having the functional groups represented by the general formula (3):

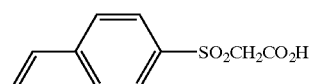
M-16

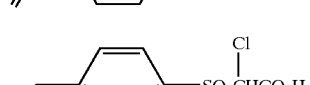
M-17

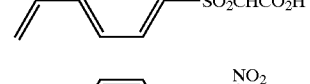
M-18

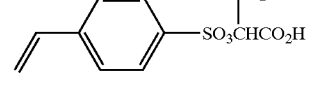
M-19

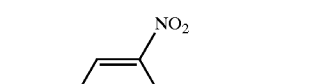
M-20

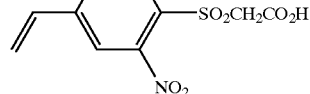
M-21

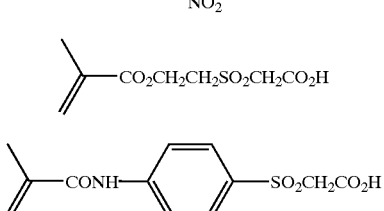
M-22

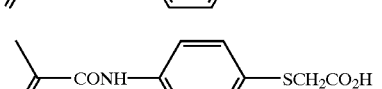

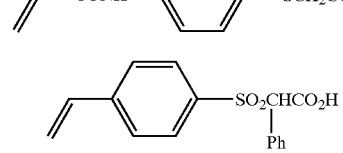
M-23

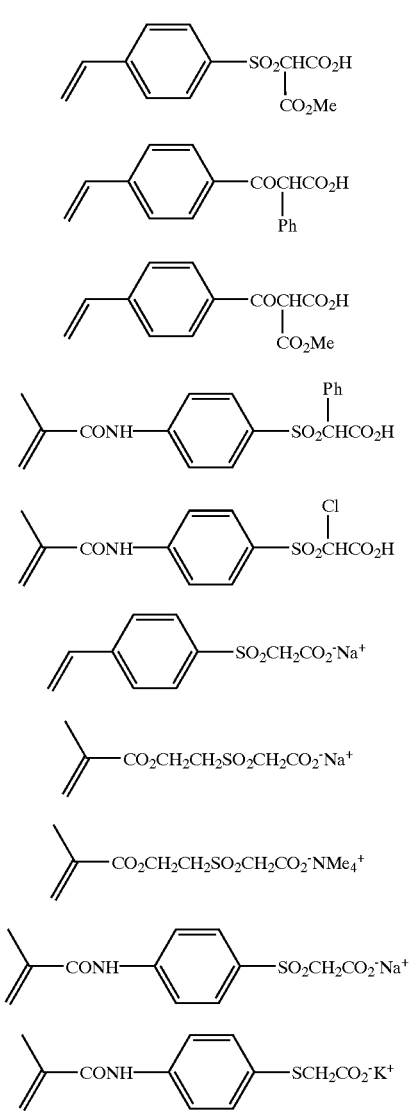

M-24
M-25
M-26
M-27
M-28
M-29
M-30
M-31
M-32
M-33

Next, a functional group which changes between the hydrophilic property and the hydrophobic property due to an acid will be described. When a photo-acid generator is used in combination with the compound introduced to the functional group that changes between hydrophilic and hydrophobic properties, heating or exposure to such radiation as an infrared laser generates the acid without it being directly added to the compound. The generated acid causes the functional group to change between the hydrophilic property and the hydrophobic property.

Functional Group that Changes Between the Hydrophilic and the Hydrophobic Properties Due to an Acid A functional group changing from the hydrophobic to the hydrophilic property or a functional group changing from the hydrophilic to the hydrophobic property can be used. In the invention, the use of the former is advantageous from a synthetic standpoint. For this functional group, publicly-known functional groups disclosed in various documents can be used. Specific examples thereof include groups protected by an acid-decomposable group, such as a hydroxyl group, a phenol type hydroxyl group, an amino group and a carboxyl group. These groups are disclosed in "Protective Group in Organic Synthesis" by T. W. Greene, A Wiley-Interscience Publication (1981). Particularly useful examples of these functional groups include alkoxyalkyl ester disclosed in European Patent No. 0652483 and PCT International Publication No. WO92/9934; t-butyl ester disclosed in Macromolecules, vol. 21, p. 1477 by H. Ito et al. Carboxylic acid ester protected by an acid-decomposable group, such as silyl ester or vinyl ester, are other examples of groups disclosed in documents. However, the invention is not limited to the above. Among them, a tertiary carboxylic acid ester group and the alkoxyalkyl ester functional group represented by the general formula (2) are particularly excellent.

Specific examples of preferred functional groups include functional groups (11) to (13) representing the general formula (2).

Photo-Acid Generator:

A photo-acid generator generates an acid by being irradiated with light. It is preferably added to the layer containing a high molecular compound into which the functional group changing between the hydrophobic property and the hydrophilic property due to an acid is introduced. Generally, it is suitable to select such a compound from the following: photochemical initiators for photochemical cationic polymerization; photochemical initiators for photochemical radical polymerization; photochemical discoloring agents comprising a dye; photochemical color changing agents; and known compounds which generate an acid due to light used in micro-resist and a mixture thereof.

For example, diazonium salts described in "Photogr. Sci. Eng., 18,387", S. I. Schlesinger, (1974), "Polymer, 21,423", T. S. Bal et al., (1980) and the like; ammonium salts described in U.S. Pat. Nos. 4,069,055 and 4,069,056, JP-A No. 3-140140 and the like; phosphonium salts described in "Macromolecules 17,2468", D. C. Necker et al., (1984), "Teh, Proc. Conf. Rad. Curing ASIA", C. S. Wenet al., p. 478, Tokyo, (October 1988), U.S. Pat. Nos. 4,069,055 and 4,069,056, and the like; iodonium salts described in "Macromolecules, 10(6), 1307", J. V. Crivello et al., (1977), "Chem. & Eng. News", November 28, p. 31, (1988), European Patent No. 104143, U.S. Pat. Nos. 339,049 and 410201, JP-A Nos. 2-150848 and 2-296514, and the like; sulfonium salts described in "Polymer J. 17,73", J. V. Crivello et al., (1985), "J. Org. Chem., 43,3055", J. V. Crivello et al., (1978), "J. Polymer Sci., Polymer Chem. Ed., 22,1789", W. R. Watt et al., (1984), "Polymer Bull., 14,279", J. V. Crivello et al., (1985), "Macromolecules, 14(5), 1141", J. V. Crivello et al., (1981), "J. Polymer Sci., Polymer Chem. Ed., 17,2877", J. V. Crivello et al., (1979), European Patent No. 370693, U.S. Pat. No. 3,902,114, European Patent Nos. 233567, 297443 and 297442, U.S. Pat. Nos. 4,933,377, 410,201, 339,049, 4,760,013, 4,734,444 and 2,833,827, German Patent Nos. 2904626, 3604580 and 3604581, and the like; selenonium salts described in "Macromolecules, 10(6), 1307", J. V. Crivello et al., (1977), "J. Polymer Sci., Polymer Chem. Ed., 17,1047", J. V. Crivello et al., (1979) and the like; onium salts such as arsonium salts described in "Teh, Proc. Conf. Rad. Curing ASIA", C. S. Wen et al., p. 478, Tokyo, (October 1988), and the like; organic halogenides described in U.S. Pat. No. 3,905,815, Japanese Patent Application Publication (JP-B) No. 46-4605, JP-A Nos. 48-36281, 55-32070, 60-239736, 61-169835, 61-169837, 62-58241, 62-212401, 63-70243 and 63-298339; organometal/organic halogenides described in "J. Rad. Curing, 13(4), 26", K. Meier et al., (1986), "Inorg. Chem., 19,3007", T. P. Gill et al., (1980), D. Astruc, Acc. Chem. Res., 19(12), 377(1896), JP-A No. 2-161445, and the like; photo-acid generators having an o-nitrobenzyl type protective group described in "J. Polymer Sci., 25,753", S. Hayase et al., (1987), "J. Polymer Sci., Polymer Chem. Ed., 23,1", E. Reichman et al., (1985), "J. Photochem., 36, 85, 39, 317", Q. Q. Zhu et al., (1987), "Tetrahedron Lett., (24)2205", B. Amit et al. (1973), "J. Chem., Soc., 3571", D. H. R. Barton et al., (1965), "J. Chem. Soc., Perkin I, 1695", P. M. collins et al., (1975), "Tetrahedron Lett.,(17), 1445", M. Rudinstein et al., (1975), "J. Am. Chem. Soc., 110,7170", J. W. Walker et al., (1988), "J. Imaging Technol., 11(4)", S. C. Busman et al., (1985), "Macromolecules, 21,2001", H. M. Houlihan et al., (1988), "J. Chem. Soc., Chem. Commun., 532", P. M. Collins et al., (1972), "Macromolecules, 18,1799", S. Hayase et al., (1985), "J. Electrochem. Soc., Solid State Sci. Technol., 130(6)", E. Reichmanis et al., "Macromolecules, 21,2001", F. M. Houlihan et al., (1988), European Patent Nos. 0290750, 046083, 156535, 271851 and 0388343, U.S. Pat. Nos. 3,901,710 and 4,181,531, JP-A Nos. 60-198538 and 53-133022, and the like; compounds which are photochemically decomposed to generate sulfonic acid represented by iminosulfonate, described in "Polymer Preprints Japan, 35(8)", TUNOOKA et al., "J. Rad. Curing, 13(4)", G. Berner et al., "Coating Technol.", 55(697), 45 (1983), W. J. Mijs et al., "Polymer Preprints, Japan", 37(3), Akzo, H. Adachi et al., European Patent Nos. 0199672, 84515, 199672, 044115 and 0101122, U.S. Pat. Nos. 4,618,554, 4,371,605 and 4,431,774, JP-A Nos. 64-18143, 2-245756 and 3-140109, and the like; and disulfone compounds described in JP-A No. 61-166544 can be used.

Furthermore, compounds in which an acid generator is introduced into a main chain or a side chain of the polymer,—compounds described in "J. Am. Chem. Soc., 104, 5586", M. E. Woodhouse et al., (1982), "J. Imaging Sci., 30(5), 218", S. P. Pappas et al., (1986), "Makromol. Chem. Rapid Commun., 9,625", S. Kondo et al., (1988), "Makromol, Chem. 152, 153, 163", Y. Yamada et al., (1972), "J. Polymer Sci., Polymer Chem. Ed., 17,3845", J. V. Crivello et al., (1979), U.S. Pat. No. 3,489,137, German Patent No. 3914407, JP-A Nos. 63-26653, 55-164824, 62-69263, 63-14603, 63-163452, 62-153853 and 63-146029— and the like can be used.

Moreover, compounds which generate an acid by light, described in "Synthesis, (1),1", V. N. R. Pillai, (1980), "Tetrahedron Lett., (47)4555", A. Abad et al., (1971), "J. Chem. Soc., (C), 329", D. H. R. Barton et al., (1970), U.S. Pat. No. 3,779,778, European Patent No. 126712, and the like can also be used.

The amount of the photo-acid generator added to the high molecular compound-containing layer is usually in the range of 0.001 to 40% by weight based on the total solid of the layer. Preferably it is in the range of 0.01 to 20% by weight, and more preferably in the range of 0.1 to 5% by weight.

Support Surface:

The conductive pattern-forming material of the invention includes a surface graft layer to which an end of the aforementioned high molecular compound having a polarity conversion group is chemically bonded directly or via a truncated high molecular compound. It includes also a support surface to which the end of the high molecular compound can be chemically bonded directly or via a truncated high molecular compound. As previously described, the surface of the support may have such properties, or may include an intermediate layer having such bonding properties provided on the surface of the support.

Support Surface or Intermediate Layer:

The support surface may be comprised of either an inorganic layer or an organic layer so long as it has properties suitable for the graft synthesis of the surface graft layer. In the invention, the polarity of the surface does not become a problem because the change between the hydrophilic and hydrophobic properties is produced by the pattern-forming layer comprised of a high molecular compound in the form of a thin layer. The support surface may be either hydrophilic or hydrophobic.

Particularly, when the thin-layer polymer of the invention is synthesized by a graft photopolymerization, plasma-exposure graft polymerization, or radiation-exposure graft polymerization methods, the intermediate layer may preferably be a layer having an organic surface, and more preferably, a layer of organic polymer. Either a synthetic resin organic polymer,—such as epoxy resin, acrylic resin, urethane resin, phenol resin, styrene based resin, vinyl based resin, polyester resin, polyamide based resin, melamine based resin and formalin resin—or a natural resin organic polymer,—such as gelatin, casein, cellulose and starch,—can be used. However, in the graft photopolymerization, plasma-exposure graft polymerization, and radiation-exposure graft polymerization methods or the like, graft polymerization starts from the removal of hydrogen from the organic polymer. Therefore, it is preferable to use a polymer from which hydrogen is readily let out. For this, acrylic resin, urethane resin, styrene based resin, vinyl, based resin, polyester resin, polyamide based resin, or epoxy resin, are particularly preferable from the standpoint of production suitability.

The aforementioned intermediate layer may also serve as a substrate (support), or it may be provided on the support if necessary.

Light-to-Heat Converting Material:

When an image is recorded on the conductive pattern-forming material of the invention using an IR laser, it preferably contains in it somewhere a light-to-heat converting material for converting light energy to heat energy. The portion in which the light-to-heat converting material is contained may be, for example, a pattern-forming layer, an intermediate layer, or a support substrate. Alternatively, a layer comprised of light-to-heat converting material may be provided between the intermediate layer and the support substrate.

Any material which can absorb light such as ultraviolet rays, visible light, infrared rays, or white light beam, and convert the same into heat can be used as the light-to-heat converting material of the invention. Examples thereof include carbon black, carbon graphite, a pigment, phthalocyanine based pigment, iron powder, graphite powder, brown iron oxide, lead oxide, silver oxide, chromium oxide, iron sulfate and chromium sulfate. In the invention, a dye, a pigment, or fine metal powder having a maximum absorption wavelength in the range of 760 nm to 1200 nm,—the exposure wavelength of an infrared laser used for writing,—are particularly preferable.

Any of the known dyes can be used, such as commercially available dyes, or dyes described in, for example, the "Dye Handbook", edited by the Organic Synthetic Chemistry Association, published in 1970. Specific examples thereof include azo dyes, metal complex salt azo dyes, pyrazolone azo dyes, anthraquinone dyes, phthalocyanine dyes, carbonium dyes, quinonimine dyes, methine dyes, cyanine dyes, metal thiolate complexes and the like. Preferred examples of dyes include cyanine dyes described in JP-A Nos. 58-125246, 59-84356, 59-202829 and 60-78787; methine dyes described in JP-A Nos. 58-173696, 58-181690 and 58-194595; naphthoquinone dyes described in JP-A Nos. 58-112793, 58-224793, 59-48187, 59-73996, 60-52940 and 60-63744; squarylium dyes described in JP-A No.

58-112792 and the like; and cyanine dyes described in British Patent No. 434875.

Further, it is suitable to use near-infrared absorbing sensitizers described in U.S. Pat. No. 5,156,938. It is also preferable to use substituted arylbenzo(thio)pyrylium salts described in U.S. Pat. No. 3,881,924, trimethinethiapyrylium salts described in JP-A No. 57-142645 (U.S. Pat. No. 4,327,169), pyrylium based compounds described in JP-A Nos. 58-181051, 58-220143, 59-41363, 59-84248, 59-84249, 59-146063 and 59-146061, cyanine dyes described in JP-A No. 59-216146, pentamethinethiopyrylium salts described in U.S. Pat. No. 4,283,475, and pyrylium compounds described in JP-B Nos. 5-13514 and 5-19702. Near-infrared absorbing dyes are other preferred examples of dyes described in U.S. Pat. No. 4,756,993 as formulae (I) and (II). Among these dyes, cyanine dyes, squarylium dyes, pyrylium salts and nickel thiolate complexes are particularly preferred.

The pigments used in the invention are commercially available pigments, and those described in, for example, the "Color Index (C.I.) Handbook, the "Latest Pigment Handbook (Saishin Ganryo Binran)", edited by Japan Associationg of Pigment Technology (Nippon Ganryo Gijutsu Kyokai) published in 1977, the "Latest Pigment Application Technologies (Saishin Ganryo Ooyo Gijutsu)", CMC, 1986, and the "Printing Ink Technologies (Insatsu Ink Gijutsu)", CMC, 1984. Examples of pigments include black pigments, yellow pigments, orange pigments, brown pigments, red pigments, purple pigments, blue pigments, green pigments, fluorescent pigments, metal powder pigments, and polymers containing chemically combined dyes. Specific examples of the pigments are insoluble azo pigments, azo lake pigments, condensed azo pigments, chelated azo pigments, phthalocyanine based pigments, anthraquinone based pigments, perylene- and perynone-based pigments, thioindigo based pigments, quinacridone based pigments, dioxadine based pigments, isoindolinone based pigments, quinophthalone based pigments, dyed lake pigments, azine pigments, nitroso pigments, natural pigments, fluorescent pigments, inorganic pigments, carbon black and the like. Among these pigments, carbon black is preferred.

Dyes or pigments may be used in the range of 0.01 to 50% by weight in total solids in the layer containing the light-to-heat converting material, preferably in the range of 0.1 to 10% by weight, and more preferably in the range of 0.5 to 10% by weight in the case of the dyes, and 3.1 to 10% by weight in the case of the pigments. If the accreted amount of the pigments or dyes is less than 0.01% by weight, sensitivity decreases. If this amount exceeds 50% by weight, the film strength of the layer containing the light-to-heat converting material becomes lower.

Support:

The support used by the invention has a surface to which an end or a side chain of the hydrophilic compound having a polymeric group is chemically bonded directly or via a truncated high molecular compound. The support itself may have such bonding properties or it may include an intermediate layer having such properties provided thereon.

Support Surface or Intermediate Layer:

The support surface may be comprised of either an inorganic or organic layer so long as it has properties suitable for graft synthesis of the surface graft layer.

Particularly, when a thin-layer polymer is synthesized using the graft photopolymerization, plasma-exposure graft polymerization, or radiation-exposure graft polymerization methods, the support surface may preferably be comprised of an organic layer, and more preferably a layer of organic polymer. Either a synthetic resin organic polymer,—such as epoxy resin, acrylic resin, urethane resin, phenol resin, styrene based resin, vinyl based resin, polyester resin, polyamide based resin, melamine based resin and formalin resin, or a natural resin organic polymer,—such as gelatin, casein, cellulose and starch,—can be used. However, in the graft photopolymerization, plasma-exposure graft polymerization, and radiation-exposure graft polymerization methods or the like, graft polymerization starts from the removal of hydrogen from the organic polymer. Therefore, it is preferable to use a polymer from which hydrogen is readily let out. For this, acrylic resin, urethane resin, styrene based resin, vinyl, based resin, polyester resin, polyamide based resin, or epoxy resin, are particularly preferable from the standpoint of production suitability.

The support surface may also be formed so as to function as a substrate (support) described later. Further, it may be an intermediate layer provided thereon if necessary.

Substrate for Support:

The support (substrate) used for the pattern-forming material of the invention and having a surface which possesses the aforementioned bonding properties is preferably a plate-shaped material which is dimensionally stable. Examples thereof include inorganic substrates such as paper, paper laminated with plastics (for example, polyethylene, polypropylene and polystyrene), a metallic plate (for example, aluminum, zinc and copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinylacetal), or paper or plastic film laminated or deposited with the aforementioned metallic material, glass, and ceramics. Among them, polyester film, a film of cellulose triacetate, and an aluminum plate are preferred. When the method of the invention is applied to the production of TFT, the substrate for the support may be comprised of insulating material, typically glass material. However, as stated above, any substrate that satisfies dimensional stability for a high adhesiveness to the layer containing the high molecular compound can be used. A resin substrate is possible because it meets this criteria. For example, a polyester film and a film of cellulose triacetate which can also serve as the intermediate layer are particularly preferred.

An aluminum plate used as the base material may be subjected to known surface treatment such as surface roughening or anodic oxidation, if necessary.

Further, when the use of a plastic film, such as a polyester film, is desired, it is preferable to subject it to surface roughening for forming a hydrophilic surface and obtaining adhesiveness.

When the support used for a planographic printing plate precursor of the invention also functions as the intermediate layer, a film comprised of the aforementioned resin material can be used for the intermediate layer. In this case, also it is preferable that the support surface, to which the high molecular compound for forming the pattern-forming layer is directly chemically bonded, is surface roughened.

When the roughened support is used, the surface properties preferably satisfy the following conditions.

The roughened surface of the support may preferably satisfy at least one of the conditions of two-dimensional roughness parameters: center line average roughness (Ra) in the range of 0.1 to 1 $\mu$m; maximum height (Ry) in the range of 1 to 10 $\mu$m; ten-point average roughness (Rz) in the range of 1 to 10 $\mu$m; unevenness average interval (Sm) in the range of 5 to 80 $\mu$m; local-peak average interval (S) in the range of 5 to 80 µm; maximum height (Rt) in the range of 1 to 10 µm; center line peak height (Rp) in the range of 1 to 10 µm; and center line trough depth (Rv) in the range of 1 to 10 µm. Satisfying all conditions is more preferable.

The aforementioned two-dimensional roughness parameters are based on the following definitions.

Center line average roughness (Ra): a portion of length L measured along the center line is extracted from a roughness curve and an absolute value of a deviation between the extracted center line and the roughness curve is arithmetically averaged to thereby obtain Ra.

Maximum height (Ry): a reference length is extracted from the roughness curve in the direction of the average line, and the interval between a peak line and a trough line of the extracted portion is measured in the direction in which the roughness curve extends at a longitudinal magnification to thereby obtain Ry.

Ten-point average roughness (Rz): a reference length is extracted from the roughness curve in the direction of the average value. Altitudes (YP) of the highest to the fifth highest peaks and depth altitudes (YV) of the deepest to the fifth deepest troughs are measured from the average line of the extracted portion in the direction of longitudinal magnification, and a sum of an average value of absolute values of the altitudes (YP) and an average value of absolute values of the altitudes (YV) is represented by a unit of µm to thereby obtain Rz.

Unevenness average interval (Sm): a reference length is extracted from the roughness curve in the direction of the average line, and a sum of average lines corresponding to one peak and one trough adjacent thereto in the extracted portion is obtained, and an arithmetic average value of a large number of unevenness intervals is represented by micrometers (µm) to thereby obtain Sm.

Local-peak average interval (S): a reference length is extracted from the roughness curve in the direction of the average line, and a length of the average line corresponding to a portion between adjacent local peaks in the extracted portion is obtained, and an arithmetic average value of intervals of a large number of local peaks is represented by micrometers (µm) to thereby obtain S.

Maximum height (Rt): a value of an interval between two straight lines, which are parallel to a center line of a portion obtained by extracting a reference length from the roughness curve, with the extracted portion being interposed between the two straight lines, is obtained as Rt.

Center line height (Rp): a length L measured in the direction of the center line is extracted from the roughness curve, and a value of the interval between the length L and a straight line passing parallel to the center line of the extracted portion and through the highest peak is obtained as Rp.

Center line trough depth (Rv): a length L measured in the direction of the center line is extracted from the roughness curve, and a value of the interval between the length L and a straight line passing parallel to the center line of the extracted portion and through the deepest trough is obtained as Rv.

In the conductive pattern-forming material of the invention, the support to which the aforementioned high molecular compound is directly chemically bonded may have a roughened surface for forming a pattern-forming layer and obtaining adhesiveness to the pattern-forming layer.

Pattern-Forming Method:

Next, a pattern-forming method of the invention using the aforementioned pattern-forming material will be described.

As a pattern-forming mechanism of the aforementioned pattern-forming material, a polarity conversion group of a high molecular compound contained in the aforementioned high molecular compound-containing layer is heated, or the polarity of a radiation-exposure region is converted so as to have a positive or negative charge. When a fluid is locally applied and adsorbed to this region, the adsorption region becomes one which exhibits the properties of the fluid. For example, when the fluid is comprised of conductive materials or conductive particles dispersed therein, the adsorption layer becomes a conductive region and wiring is formed therein. In a non-heated region or in a region irradiated without radiation, the high molecular compound-containing layer remains unchanged with the surface, and as the fluid is not adsorbed to the layer, it becomes an insulating region.

Further, the adsorption layer can be formed by adsorbing a hydrophilic fluid to a hydrophilic region obtained by polarity conversion, or by adsorbing a hydrophobic fluid directly to a hydrophobic region Using the case of TFT production as an example, the polarity of the surface of the high molecular compound-containing layer is converted by pattern exposure using ultraviolet rays to visible light, infrared laser, or local heating, and a TFT substrate with changing fluid compatibility is subjected to the pattern exposure to thereby form an acceptor pattern. Droplets of a fluid solution of conductive material are then applied to the pattern using an ink-jet device. The applied fluid shows a behavior of being on the verge of spreading due to surface tension and easily spreads to the pattern acceptor region. However, the fluid is not capable of spreading to a region having no compatibility with the fluid although no barrier material is provided. The fluid is adsorbed only to the formed pattern acceptor region, and a fine fluid image corresponding to the exposure (heating) pattern is formed therein.

The adsorption of fluid can also be performed, for example, by immersing the substrate in a liquid tank filled with the fluid. In this case as well, the fluid is adsorbed only to the acceptor region. However, when the aforementioned method is applied to the production of a member in which fluids having different properties need to be regularly adsorbed to a very small portion in accordance with the pattern (as in the case of TFT), a process of respective substrate immersion in different fluids is carried out. Therefore, the pattern to which the fluid is adsorbed in the first immersion process is apt to be affected both physically and chemically by a second immersion with a different fluid. This can cause local peeling. There is also a strong possibility that a mixing or a reaction of fluids may occur. Therefore, the aforementioned immersion method is not preferred.

In the invention, even after an acceptor pattern of fluid is formed by exposure, the fluid to be locally adsorbed is supplied to a selected region using an ink-jet device or the like, and regions with different fluids adsorbed thereto are formed on the same substrate in a simple manner and using only a small amount of fluid. Therefore, there is no fear of the different fluids affecting each other. As the intended fluid performance can thus be maintained, the method of the invention is very useful.

Writing:

The writing of an image on the conductive pattern-forming material of the invention is performed by irradiation with such radiation as light, or by heating. Concerning one aspect of light irradiation, a pattern can be formed by heating using a scanning exposure of laser light in an infrared region is such type of irradiation is compatible with the aforementioned light-to-heat converting material.

Pattern formation employs a method in which writing is carried out by heating or irradiation with radiation (exposure). Light irradiation can be carried out, for example, by an infrared laser, an ultraviolet lamp, or visible light; electron beam irradiation by using a gamma ray; and thermal recording by using a thermal head. Examples of a light source that can be used include a mercury lamp, a metal halide lamp, a xenon lamp, a chemical lamp, and a carbon arc lamp. Examples of radiation include an electron beam, X-rays, an ion beam, far infrared radiation and the like. Further, g ray, i ray, deep-UV light, and a high-density energy beam (laser beam), can also be used.

Suitable specific methods generally employed are a direct imagewise recording using a thermal recording head or the like, scanning exposure by an infrared laser, high-illumination flash exposure using a xenon discharging lamp, and infrared lamp exposure and the like.

A method for causing polarity conversion using laser exposure is preferably used in order to carry out direct pattern formation using the digital data of a computer. Examples of lasers include gas lasers such as the carbon dioxide laser, nitrogen laser, Ar laser, He/Ne laser, He/Cd laser and Kr laser; solid state lasers such as the liquid (dye) laser, ruby laser and Nd/YAG laser; semiconductor lasers such as the GaAs/GaAlAs laser and InGaAs laser; excimer lasers such as the KrF laser, XeCl laser, XeF laser, $Ar_2$, and the like. From among the above, exposure by a semiconductor laser which radiates infrared rays having a wavelength of 700 to 1200 nm, or a high-output infrared solid laser such as an YAG laser, is suitable.

Next, a pattern-forming material and a pattern-forming method according to a second embodiment of the invention will be described.

Formation of Hydrophilic Pattern by Surface Graft

A hydrophilic compound having a polymeric group is made to contact a support, and energy is applied to the support. The result is that the polymeric group of the hydrophilic compound and the support produce a chemical bond that allows the formation of a hydrophilic region having strength, excellent durability, and high hydrophilic properties. Production of such a bond is referred to as a surface graft. This corresponds to the means called surface graft polymerization as explained concerning the pattern-forming layer of the first embodiment of the invention. In the first embodiment, the high molecular compound to be grafted has a polarity conversion group. However, in the present embodiment, a composition containing a polymeric hydrophilic compound is directly bonded to active species generated on the surface of a support while being made to contact the support.

The support may be immersed in a liquid composition containing a polymeric hydrophilic compound during contact. Preferably, as will be described later, a layer containing the composition containing the polymeric hydrophilic compound, as a main component is formed on the surface of the support using a coating method. This is preferred from the standpoint of handling and production efficiency of the conductive pattern material.

A description will be given hereinafter of the formation of surface graft by imparting energy.

In the invention, the formation of a hydrophilic region is carried out by a method called surface graft polymerization. Graft polymerization means a method in which energy is imparted to a high molecular compound chain by a conventionally known method using light, electron beam or the like to produce active species. The method then employs the polymerization of another polymerization starting compound to synthesize a graft polymer. In particular, surface graft polymerization refers to a method in which a surface is formed by a high molecular compound which produces active species.

Ordinarily, a support surface for forming a material base, such as PET, is directly processed using plasma or an electron beam to allow a radical to be generated on the surface, manifesting polymerization initiating ability. Thereafter, the active surface and a monomer having a hydrophilic functional group are made to react on each other, and a graft polymer surface layer, that is, a surface layer having a hydrophilic group, is obtained. In the preferred embodiment of the invention, formation of such active sites can readily be performed at low energy by adding a compound having a polymerization initiating ability to the support. Moreover, as there exist many active sights to be generated, a simple method can be employed to form a surface having even higher hydrophilic properties.

Well known methods for causing graft polymerization by means of light irradiation can be used. Specific methods for graft photopolymerization disclosed in JP-A Nos. 63-92658, 10-296895 and 11-119413 can also be used in the invention. Such methods are ones in which a polymerization initiator and a polymeric composition comprised of a polymeric compound are applied in advance onto a support. A hydrophilic compound having a polymeric group is made to contact thereon and then it is irradiated with light.

Another method for forming a patterned hydrophilic compound is one described in "T. Matsuda, Y. Nakayama Langmuir 1999 vol. 15", page 5560, and "Macromolecules 1996 vol. 29", page 8622, in which a hydrophilic monomer is made to contact a polymer substrate having a N,N-diethylthiocarbamate group. The substrate is then exposed in a patterned manner to cause surface graft polymerization and a hydrophilic pattern with polyacrylate fixed to the surface is formed.

A photo-grafting method in which energy is imparted by means of light irradiation is preferred among the methods for surface grafting.

Hydrophilic Compound Having a Polymeric Group:

The hydrophilic compound having a polymeric group of the invention is a hydrophilic compound containing a radical polymeric group, in which an ethylene-added polymeric unsaturated group, such as a vinyl group, an allyl group or a (meth)acrylic group, is introduced as a polymeric group into a hydrophilic monomer, described later; or a hydrophilic homopolymer or copolymer is obtained by using at least one kind of a hydrophilic monomer. This compound has a polymeric group at least at an end or at a side chain. A compound having a polymeric group at the end is preferred, and a compound having polymeric groups both at the end and at a side chain is even more preferred.

The aforementioned hydrophilic compound containing a radical polymeric group, into which an ethylene-added polymeric unsaturated group is introduced, is synthesized in the manner described below.

Examples of the synthesis method include: a method in which a hydrophilic monomer and a monomer having an ethylene-added polymeric unsaturated group are copolymerized; a method in which a hydrophilic monomer and a monomer having a double bond precursor are copolymerized, and subsequently a double bond is introduced by a basic process or the like; a method in which the functional group of a hydrophilic compound and a monomer having an ethylene-added polymeric unsaturated group are made to react to each other. Among these methods, the latter is particularly preferred from the standpoint of synthesis suitability.

Examples of hydrophilic monomers used for synthesis of the hydrophilic compound having a radical polymeric group at a main chain end and/or at a side chain, include monomers having a hydrophilic group, that is, (meth)acrylic acid or alkali metal salt and amine salt thereof; itaconic acid or alkali metal salt and amine salt thereof; 2-hydroxyethyl (meth)acrylate, (meth) acrylamide, N-monomethylol(meth) acrylamide, N-dimethylol(meth)acrylamide, allylamine or halogenated hydroacid salt thereof; 3-vinyl propionic acid or alkali metal salt and amine salt thereof, a carboxyl group such as 2-sulfoethyl(meth) acrylate, polyoxyethyleneglycol mono(meth)acrylate, 2-acrylamide-2-methylpropanesulfonic acid or acid phosphooxypolyoxyethyleneglycol mono(meth)acrylate; a sulfonate group, a phosphate group, an amino group or salts thereof; a hydroxyl group, an amide group, and an ether group.

Allyl(meth)acrylate and 2-allyloxyethylmethacrylate can be used as the allyl group-containing monomers copolymerized with the hydrophilic monomer.

2-(3-chloro-1-oxopropoxy)ethylmethacrylate can be used as a monomer having a double bond precursor.

(Meth)acrylic acid, glycidyl(meth)acrylate, allylglycidyl ether, 2-isocyanatoethyl(meth)acrylate and the like can be used as monomers having an addition-polymeric unsaturated group used for introducing an unsaturated group utilizing a reaction on a functional group such as a carboxyl group, an amino group or salts thereof, a hydroxyl group or an epoxy group in the hydrophilic monomer.

A preferred example of the hydrophilic compound having a polymeric group at the end and/or at the side chain is a hydrophilic macromonomer. Various methods have been proposed for producing a macromonomer used by the invention in "Macromonomer no Kagaku to Kogyo", chapter 2: Macromonomer no Gosei, edited by Yuya Yamashita, I.P.C., Sep. 20, 1989. Useful examples of hydrophilic monomers used by the invention include macromonomers derived from a carboxyl group-containing monomer, such as acrylate or methacrylate; a sulfonate-based macromonomer derived from a monomer such as 2-acrylamide-2-methylpropanesulfonate, vinylstyrene sulfonate and salts thereof; an amide-based macromonomer derived from a monomer such as (meth)acrylamide, N-vinylacetoamide, N-vinylformamide or N-vinylcarboxylic acid amide; a macromonomer derived from a hydroxyl group-containing monomer, such as hydroxyethylmethacrylate, hydroxyethylacrylate or glycerolmonomethacrylate; and a macromonomer derived from a monomer containing an alkoxy group or an ethyleneoxide group, such as methoxyethylacrylate, methoxypolyethyleneglycolacrylate or polyethyleneglycolacrylate. Further, a monomer having a polyethylene glycol chain or a polypropylene glycol chain can be used to advantage as the macromonomer of the invention.

The molecular weight of the macromonomer has a serviceable value in the range of 250 to 100000, and more preferably in the range of 400 to 30000.

Hydrophilic Monomer Used to Advantage in Combination with the Aforementioned Hydrophilic Macromonomer:

A hydrophilic monomer may also be added to the aforementioned hydrophilic macromonomer having a polymeric group. Addition of the hydrophilic monomer can increase the rate of polymerization.

The amount of the hydrophilic monomer added is preferably in the range of 0 to 60% by weight based on the total solid content of the hydrophilic compound having all polymeric groups. If the hydrophilic monomer is not less than 60% by weight, coating efficiency is poor and it cannot be uniformly applied. This is not suitable.

Monomers having a positive charge, such as ammonium or phosphonium, or monomers having a negative charge, such as a sulfonate group, a carboxyl acid group, a phosphate group or a phosphonic acid group, or having an acidic group which can be dissociated from a negative charge, can be used to advantage as hydrophilic monomers in combination with the hydrophilic compound having a polymeric group at the end and/or at the side chain. In addition, hydrophilic monomers having a nonionic group, such as a hydroxyl group, an amide group, a sulfonamide group, an alkoxy group or a cyano group can also be used.

In the invention, specific examples of hydrophilic monomers which are particularly used to advantage in combination with the hydrophilic macromonomer, are (meth)acrylic acid or alkali metal salt and amine salt thereof; itaconic acid or alkali metal salt and amine acid salt thereof; allylamine or halogenated hydroacid salt thereof; 3-vinylpropionic acid or alkali metal salt and amine salt thereof; vinyl sulfonic acid or alkali metal salt and amine salt thereof; vinylstyrene sulfonic acid or alkali metal salt and amine salt thereof; 2-sulfoethylene(meth)acrylate, 3-sulfopropylene(meth) acrylate or alkali metal salt and amine salt thereof; 2-acrylamide-2-methylpropane sulfonic acid or alkali metal salt and amine salt thereof; a carboxyl group, a sulfonate group, a phosphate group, an amino group, or salts thereof, such as acid phosphooxypolyoxyethyleneglycol mono (meth)acrylate or allylamine; a carboxyl group, a sulfonate group, a phosphate group, an amino group, or salts thereof, such as 2-trimethylaminoethyl(meth)acrylate or halogenated hydroacid salt. Further, monomers having an amino acid skeleton in a molecule, such as 2-hydroxyethyl(meth) acrylate, (meth)acrylamide, N-monomethylol(meth) acrylamide, N-dimethylol(meth)acrylamide, N-vinylpyrolidone, N-vinylacetoamide, allylamine or halogenated hydroacid salt thereof; polyoxyethyleneglycolmono (meth)acrylate or N-methacryloyloxyethylcarbamate aspartic acid; monomers having a sugar skeleton in a molecule, such as glykoxyethylmethacrylate and the like, caan be used to advantage.

There are no particular limits to a solvent used for a composition containing such a hydrophilic compound so long as the hydrophilic macromonomer or hydrophilic monomer, which are the main components, can be dissolved therein. An aqueous solvent such as water or a water-soluble solvent is preferred. Preference is also given to a mixture of this, or a solvent with a surface active agent added.

A water-soluble solvent means a solvent which is capable of blending with water at an arbitrary ratio. Examples thereof include an alcohol-based solvent such as methanol, ethanol, propanol, ethylene glycol or glycerin; acid such as acetic acid; a ketone-based solvent such as acetone; an amide-based solvent such as formamide, and the like.

It suffices if the surface active agent can be dissolved in the solvent. Examples thereof include an anionic surface active agent such as n-dodecylbenzene sodium sulfonate; a cation-based surface active agent such as n-dodecyltrimethylammoniumchloride; a nonionic surface active agent such as polyoxyethylenenonylphenol ether (for example, "Emulgen 910" commercially available from Kao Corporation), polyoxyethylenesorbitan monolaurate (for example, "Tween 20" commercially available from Kao Corporation) or polyoxyethylenelauryl ether, and the like.

A method in which the composition is made to contact the support surface in a liquid state can be performed arbitrarily. When the coating layer comprised of the composition containing the hydrophilic compound is formed by a coating method, the amount thereof applied is preferably in the range of 0.1 to 10 g/m² in terms of solids, and more preferably in the range of 1 to 5 g/m². If it is less than 0.1 g/m², sufficient surface hydrophilicity cannot be obtained. Further, if it exceeds 10 g/m², a uniform coating film is difficult to form. Either case is not preferred.

Support:

The support of the invention has a surface to which an end or a side chain of the hydrophilic compound having a polymeric group is chemically bonded directly or via a truncated high molecular compound. The support itself may have such bonding properties, or may include an intermediate layer having such properties provided thereon.

Support Surface or Intermediate Layer:

The support surface may be comprised of either an inorganic layer or an organic layer so long as it has the properties suitable for graft synthesis of the surface graft layer.

Particularly, when the thin-layer polymer is synthesized using the graft photopolymerization method, the plasma-exposure graft polymerization method, or the radiation-exposure graft polymerization method, the support surface may preferably be comprised of an organic layer, more preferably a layer of organic polymer. Either a synthetic resin organic polymer,—such as epoxy resin, acrylic resin, urethane resin, phenol resin, styrene based resin, vinyl based resin, polyester resin, polyamide based resin, melamine based resin and formalin resin—or a natural resin organic polymer,—such as gelatin, casein, cellulose and starch,—can be used. However, in the graft photopolymerization, plasma-exposure graft polymerization, and radiation-exposure graft polymerization methods or the like, graft polymerization starts from the removal of hydrogen from the organic polymer. Therefore, it is preferable to use a polymer from which hydrogen is readily let out. For this, acrylic resin, urethane resin, styrene based resin, vinyl, based resin, polyester resin, polyamide based resin, or epoxy resin, are particularly preferable from the standpoint of production suitability.

The support surface may also be formed so as to function as a substrate (support), as described later. Further, it may be an intermediate layer provided thereon if necessary.

Support Substrate:

The support (substrate) used for the conductive pattern-forming material of the invention, and having a surface which possesses the aforementioned bonding properties, is preferably a plate-shaped material which is dimensionally stable. Specific examples thereof include the same as those for the support substrate described in the first embodiment.

Further, in the present embodiment, the support substrate, to which the hydrophilic compound is directly chemically bonded, may preferably have a roughened surface. This is from the standpoint of obtaining adhesiveness for forming a pattern-forming layer. It is preferable if roughened surface properties of the substrate satisfy the aforementioned conditions.

Layer Which Exhibits Polymerization Initiating Ability:

In the invention, it is preferable from the standpoint of efficiently producing active sites and improving pattern-formation sensitivity, that a layer which exhibits the polymerization initiating ability to function as the intermediate layer or the support surface is formed by adding,—as the compound which exhibits the polymerization initiating ability due to energy imparted,—a polymeric compound and a polymerization initiator to the support surface.

The layer which exhibits the polymerization initiating ability (hereinafter referred to as a polymeric layer as required) can be formed by dissolving required components in a solvent which allows the components to be dissolved therein, and applying the dissolved mixture onto the support surface using a coating method or the like, and further making it into a hardened film by heating or light irradiation.

(a) Polymeric Compound

The polymeric compound used for the polymeric layer is not particularly limited so long as it has excellent adhesiveness to the support, a hydrophilic compound contained in an upper layer due to energy imparted by such means as irradiation with active light, and that it has a polymeric group at the end and/or at the side chain that can be added thereto. Particularly, a hydrophobic polymer having a polymeric group in a molecule is preferred.

Examples of such hydrophobic polymers include: diene-based homopolymers such as polybutadiene, polyisoprene and polypentadiene; homopolymers of allyl group-containing monomers such as allyl(meth)acrylate and 2-allyloxyethylmethacrylate; two- or multi-dimensional copolymers with styrene, (meth)acrylic ester or (meth)acrylonitrile, in which a diene based monomer such as polybutadiene, polyisoprene or polypentadiene, and an allyl group-containing monomer are contained as structural units; linear macromolecules or three-dimensional high polymers having a carbon-carbon double bond in a molecule, such as unsaturated polyester, unsaturated polyepoxide, unsaturated polyamide, unsaturated polyacryl and high-density polyethylene.

In this specification, one or both of "acryl" and "methacryl" is occasionally represented as "(meth)acryl".

The amount of the polymeric compound contained in the polymeric layer is preferably in the range of 0 to 100% by weight based on the total solids, and more preferably in the range of 10 to 80% by weight.

(b) Polymerization Initiator

The polymeric layer of the invention preferably contains a polymerization initiator for initiating polymerization due to energy imparted thereto. In the invention, well-known heat polymerization initiators and photopolymerization initiators can be selectively used. Such initiators are capable of initiation polymerization by such means of predetermined energy as active light irradiation, heating, or electron beam irradiation. The use of photopolymerization is particularly preferable to heat polymerization from the standpoint of production suitability as it has a higher reaction rate (polymerization rate).

There are no particular limits to the photopolymerization initiator of the invention so long as it is active to irradiation by active light applied thereto, and allows a polymeric compound contained in a polymeric layer and a hydrophilic compound—comprised with a polymeric group at the end or the side chain—to be polymerized with each other. For example, a radical polymerization initiator, an anion polymerization initiator, and a cation polymerization initiator can be used.

Specific examples of such photopolymerization initiators include acetophenones such as p-tert-butyltrichloroacetophenone, 2,2'-diethoxyacetophenone and 2-hydroxy-2-methyl-1-phenylpropane-1-on; ketones such as benzophenone(4,4'-bisdimethylaminobenzophenone, 2-chlorothioxantone, 2-methylthioxantone, 2-ethylthioxantone and 2-isopropylthioxantone; benzoin ethers such as benzoin, benzoin methyl ether, benzoin isopropyl ether and benzoin isobutyl ether; and benzylketals such as benzyldimethylketal, hydroxycyclohexylphenylketone.

The amount of the polymerization initiator contained in the polymeric layer is preferably in the range of 0.1 to 70% by weight in solids, and more preferably in the range of 1 to 40% by weight.

There is no particular limit to the solvent used when the aforementioned polymeric compound and polymerization initiator are applied so long as it allows these components to be dissolved therein. A solvent whose boiling point is not so high is preferred from the standpoint of facilitating drying and increasing operating efficiency. Specifically, a solvent having a boiling point of 40 to 150° C. may be selected.

Examples of such solvents include acetone, methyl ethyl ketone, cyclohexane, etyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate and 3-methoxypropylacetate.

These solvents can be used alone or in a combination of two or more. The concentration of the solids in the coating solution is preferably in the range of 2 to 50% by weight.

The amount of the polymeric layer applied on the support is preferably in the range of 0.1 to 20 g/m$^2$ after drying, and more preferably in the range of 1 to 15 g/m$^2$. If it is less than 0.1 g/m$^2$, sufficient polymerization initiating ability cannot be manifested and the grafting of the hydrophilic compound cannot be sufficiently carried out. As a result, there is a possibility that the desired hydrophilic property may not be obtained. If it exceeds 20 g/m$^2$, film properties tend to decrease and film peeling is apt to occur. Either case is not preferred.

As described above, the polymeric layer is formed by applying the aforementioned composition for forming the polymeric layer on the support surface using a coating method and by removing the solvent to allow formation of a film. In this case, it is preferable that the film be hardened by heating and/or light irradiation. Particularly, if film hardening is preliminarily carried out by light irradiation after dried by heating, the polymeric compound is hardened in advance to some degree. Therefore, it is possible to effectively avoid the state in which the polymeric layer entirely may fall off after the grafting of the hydrophilic compound. In this case, light irradiation is used for preliminary hardening for the same reason as in the case of the aforementioned photopolymerization initiator.

The heating temperature and the time for drying may each be selectively set so that the coating solvent can be sufficiently dried. From the standpoint of production suitability, the heating temperature is preferably 100° C. or less, and more preferably in the range of 40 to 80° C. The time for drying is preferably 30 minutes or less, and more preferably 10 minutes or less.

If it is desired that light radiation be applied after heat drying, a pattern formation light source as described later can be used. From the standpoint of carrying out an uninterrupted formation of the hydrophilic pattern and avoiding obstructions in the bonding of the active sight of the polymeric layer with the graft chain, it is preferable that light irradiation be carried out so that the polymeric compound contained in the polymeric layer is not completely subjected to radical polymerization, even if radical polymerization does partially occur. The time for light irradiation depends on the intensity of the light source. Typically, 30 minutes or less is preferred. Criteria for preliminary hardening are a remaining film rate of 10% or more after solvent washing, and a remaining initiator rate of 1% or more after preliminary hardening has taken place.

Pattern Formation

There is no particular limit to the energy imparting method when a pattern is formed on the conductive pattern material of the invention. Any method can be used so long as it can produce active sites on the support surface and impart energy to allow bonding to the hydrophilic compound having the polymeric group. From the standpoint of costs and device simplicity, it is preferable to use the irradiation of active light.

When irradiation of active light is applied to imagewise exposure, either scanning exposure based on digital data or pattern exposure using a lith film can be used.

Various types of writing methods previously described in the first embodiment can be favorably used in the present embodiment as well.

From the above process a highly mobile hydrophilic graft chain is obtained from an active site generated on the support surface due to energy imparted thereto, polymerized with a hydrophilic compound having a polymeric group. Further, if desired, a branching graft chain structure can be formed with the addition of a hydrophilic compound having a polymeric group at the end and the side chain, and by bonding the hydrophilic graft chain to the polymeric group at the side chain of the graft chain bonded to the support. The density and the mobility are both greatly improved, so an even higher hydrophilic property is made manifest.

Fluid:

Next, a description will be given of the fluid introduced to the adsorption layer.

Various fluids can be used according to the pattern-forming purpose. In the invention, the fluid is not particularly limited so long as it has the flowability to be discharged from an ink exhaust nozzle of an ink-jet device (described later) at an ordinary temperature (25° C.). The fluid may be either oily or aqueous, or in addition to being a solution, it can be a solid material such as fine grains, or a dispersing liquid such as latex.

As an example of fluid applications, when an electrode is formed in the same manner as in TFT, it is possible to use either a fluid for the dissolution of a known conductive polymer like polyethylene dioxythiophene (PEDOT) in a solvent, a dispersing liquid obtained by uniformly dispersing fine grains in an appropriate dispersion medium, a dispersing liquid obtained by simultaneously dissolving a binder in conductive grains, or by mixing a latex.

Examples of conductive fine grains include metallic particles such as Au, Ag, Pt, Cu, Rh, Pd, Al and Cr; metal-oxide particles such as $In_2O_3$, $SnO_2$, ZnO, Cdo, $TiO_2$, $CdIn_2O_4$, $Cd2SnO_2$, $Zn_2SnO_4$ and $In_2O_3$—Zno; particles using material doped with impurities suitable therefor; metallic salts such as metal chloride, metal nitride, metal bromide and metal boride; and particles comprised of carbon black, high polymer electrolyte or surface active agents.

In addition to the aforementioned conductive materials, a fluid containing a colorant such as a dye or pigment, magnetic material, luminescent material or the like can be used.

Functional components contained in the fluid can be used alone or in a combination of two or more types if necessary. Further, a plurality of materials can be mixed in advance to obtain desired properties.

Conductive Material:

Next, a description will be given of conductive fine grains which can be adsorbed to the aforementioned hydrophilic pattern.

The conductive fine grains used by the invention are not particularly limited so long as they have conductivity. Fine grains comprised of known conductive material can be arbitrarily selected and used. Suitable examples thereof include metallic particles such as Au, Ag, Pt, Cu, Rh, Pd, Al and Cr; oxide semiconductor particles such as $In_2O_3$, $SnO_2$, ZnO, Cdo, $TiO_2$, $CdIn_2O_4$, $Cd_2SnO_2$, $Zn_2SnO_4$ and $In_2O_3$—ZnO; particles using material doped with impurities suitable therefor; spinel compound particles such as MgInO and CaGaO; conductive nitride particles such as TiN, ZrN and HfN; conductive boride particles such as LaB; and conductive high polymer particles (organic material).

Relationship Between Conductive Particles and Polarity of Surface Graft Polymerization of Polarity Conversion Type:

In the pattern-forming layer having an anionic graft polarity conversion functional group such as alkyl sulfonate ester group represented by the aforementioned formula (1), only an exposed region selectively has a negative charge, and with conductive particles having a positive charge being adsorbed thereto, a conductive region (wiring) is formed. When such a pattern-forming mechanism is used, the polarity is converted only in the exposed region so that the region has the ability of adsorbing conductive particles. Therefore, a wiring structure in which different types of conductive particles are provided on a single substrate (support) can be sequentially formed.

In other words, conductive pattern-forming material is exposed to make one kind of conductive particles to be adsorbed to the exposed region, and excess conductive particles are removed by washing. As a result, a first circuit is formed. At this time, the polarity conversion group of an unexposed region is not affected. Therefore, the same conductive pattern-forming material is exposed again in an imagewise manner to cause polarity conversion therein, and other conductive particles are adsorbed to another exposed region to thereby form a second circuit. This makes it possible to form circuits having different conductivities due to step-by-step imagewise exposure on the same substrate.

For such pattern formation, cationic conductive particles, such as positive charge metallic (oxide) particles are used.

Particles having a positive charge on the surface thereof at a high density can be prepared by, for example, methods described in "Chemistry Letters., 1999", T. Yonezawa, page 1061, "Langumuir 2000, vol.16, 5218", T. Yonezawa, and "Polymer preprints, Japan vol.49, 2911 (2000)", T. Yonezawa. In these methods, T. Yonezawa and others demonstrate that the surface of metallic particles can be chemically modified at a high density by a functional group having a positive charge utilizing metal-sulfur bond.

In another pattern-forming mechanism, for example, the surface of the pattern-forming layer material of a pattern-forming layer having a cationic graft polarity conversion functional group, such as an ammonium group described in JP-A No. 10-296895, inherently has a positive charge. The charge is eliminated only in the exposed region. The conductive particles having a negative charge are adsorbed to the layer surface and a conductive region is formed thereon. When such a pattern-forming mechanism is used, conductive particles are adsorbed to only the unexposed portion. Therefore, a conductive pattern-forming material suitable for the formation of a single circuit, and the formation of a conductive region having a wide area and the like, are obtained.

When either pattern-forming mechanism is used in the invention, particles bonded to the hydrophilic surface are regularly arranged substantially in a single-layer state. Relationship Between Conductive Particles and Polarity of a Hydrophilic Group of Hydrophilic Compound Bond Type:

When the hydrophilic pattern obtained in the second embodiment has an anionic property—for example, a carboxyl group, a sulfonate group or a phosphonate group—the pattern portion selectively has a negative charge, and with conductive particles having a positive charge (cationic property) being adsorbed to the portion, a conductive region (wiring) is formed.

Metal (oxide) particles having a positive charge can be used as such cationic conductive particles. Particles having a positive charge on the surface thereof at a high density can be prepared by, for example, methods described in "Chemistry Letters., 1999", page 1061, T. Yonezawa, "Langumiur 2000, vol.16, 5218", T. Yonezawa, and "Polymer preprints, Japan vol.49.2911 (2000)", T. Yonezawa. In these methods, T. Yonezawa and others demonstrate that the surface of metallic particles can be chemically modified at a high density by a functional group having a positive charge utilizing metal-sulfur bond.

When the hydrophilic pattern to be obtained has a cationic group such as an ammonium group described in JP-A No. 10-296895, the pattern portion selectively has a positive charge, and with conductive particles having a negative charge being adsorbed to the portion, a conductive region (wiring) is formed. The metallic particles having a negative charge may be gold or silver grains obtained by citrate reduction.

In either case, the particle size of the conductive particles used for forming the conductive material layer is preferably in the range of 0.1 nm to 1000 nm, and more preferably in the range of 1 nm to 100 nm. If it is less than 0.1 nm, conductivity obtained from the continuous contact of the surfaces of particles tends to deteriorate. Further, if it is more than 1000 nm, the contact area in which the particles are bonded by interaction with the polarity converted functional group becomes smaller. As a result, adhesiveness between the hydrophilic surface and the particles decreases and the strength of the conductive region may deteriorate.

In order to obtain a transparent wiring substrate, and for maintaining light transmittance, the particle size is preferably in the range of 0.2 to 100 nm, and more preferably in the range of 10 to 10 nm.

From the standpoint of durability, a maximum amount of the aforementioned particles are preferably bonded together so as to be adsorbed to the polarity conversion group or hydrophilic group on the hydrophilic surface. Further, dispersion concentration of the dispersing liquid is preferably in the range of 0.001 to 20% by weight.

The following methods are used for making conductive particles to be adsorbed to a portion in which the polarity is converted, or to a hydrophilic group: a method in which a liquid with charged conductive particles on the surfaces thereof, being dissolved or dispersed therein, is applied onto the support surface in which the polarity is converted by exposure in an imagewise manner; and a method in which the support surface whose polarity is converted imagewise is immersed in the aforementioned solution or dispersing liquid. In either the coating or the immersion method, an excess amount of conductive particles is supplied. For ionic bonding, to sufficiently introduce the particles between polarity conversion groups, the time in which the solution or dispersing liquid is in contact with the support surface is preferably in the range of 10 seconds to 24 hours, and more preferably in the range of 1 to 180 minutes.

There is no limit to a method for making the fluid so long as it is locally applied onto a solid surface using an on-off coater, an ink-jet device, a plotter device or the like. A method in which the fluid is discharged from an ink-jet head using an ink-jet device, described later, is preferably used from the standpoint of accuracy in supplying the fluid to a predetermined region, and controllability of the fluid amount supplied.

The amounts of the fluid and functional components contained therein can be appropriately determined depending on the purpose of pattern formation or the pattern-forming mechanism. However, due to ionic adsorption, these materials are to be uniformly introduced in the hydrophilic surface in a dense state. Therefore, compared with the amount of functional material used for general pattern formation, that used by the invention performs satisfactorily for functional use small amounts. For example, when conductive material is used, a conductive region having a high sharpness that finds applications in fine circuits can be formed.

A description will be given of an ink-jet recording device which can be used for the method of the invention.

First, the pattern information of an image formed on a substrate is supplied from a computer or similar information source to the ink-jet recording device via such a transmission means as a bus. This data may be the same as the writing data used for the formation of an acceptor pattern.

The ink-jet recording device may include an ink-jet recording head provided so as to discharge droplets of the fluid, and a control system for driving the recording head in accordance with an arbitrary pattern. Droplets of the fluid are discharged from a nozzle hole (exhaust opening) of the recording head which moves in accordance with the pattern information to a predetermined position on the surface of pattern-forming material. The fluid is adhered to the material surface in accordance with an image of the acceptor pattern.

The ink-jet recording head is equipped with a cavity which can be filled with fluid. A voltage corresponding to the arbitrary pattern is applied to a piezoelectric element, which is formed so as to be capable of causing a change in the volume of the cavity. As a result, the fluid stored in the cavity is fed from the exhaust opening in the shape of microdroplets and adsorbed to the pattern-forming material in a predetermined imagewise manner. Thereafter, a solvent or dispersion medium is removed from the fluid, and an imagewise fluid adsorption layer is formed.

Figure 2:
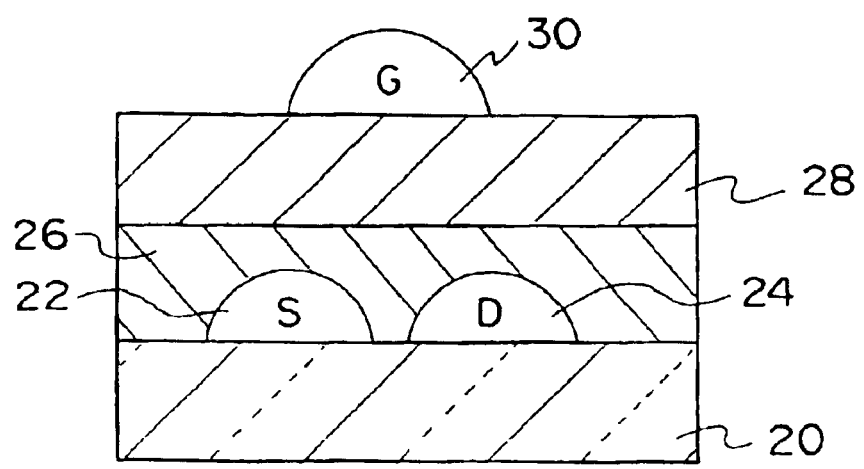
FIG. 2 is a cross-sectional view which schematically shows one aspect of an organic TFT obtained by using a method of the present invention.

The pattern-forming method of the invention will be further described in detail with reference to the production of TFT as an example. FIG. 1 shows a model diagram showing a behavior of a fluid supplied in the vicinity of an acceptor pattern. FIG. 2 is a cross sectional diagram which schematically shows one aspect of organic TFT obtained by using the method of the invention.

A pattern-forming material 10 is irradiated according to the method of the invention with an infrared laser to allow formation of regions 12 having an affinity with a fluid. When the fluid 14 is fed from an exhaust nozzle of the aforementioned ink-jet device, droplets of the fluid 14, as shown in FIG. 1, spread on the surface of the affinity regions 12 due to surface tension. The spreading of the fluid stops at the boundaries with the unexposed portions, the regions 16, as the regions 16 have no affinity with the fluid 14, and do not effect a polarity conversion. The fluid 14 is adsorbed only to the affinity regions 12.

In the aforementioned method, the surface of a support (pattern-forming material) 20 (see FIG. 2), having the high molecular compound-containing layer of the invention, is irradiated with an infrared laser to allow the regions having an affinity with the fluid to be formed thereon. Thereafter, the fluid (conductive material) by which PEDOT dissolves in a solvent is fed from the exhaust nozzle of the ink-jet device to form a source electrode 22 and a drain electrode 24. An unexposed portion (a region having no affinity with the fluid) exists between the source electrode 22 and the drain electrode 24, and the two electrodes are formed as separate circuits with an insulating region interposed therebetween. The source electrode 22 and the drain electrode 24 are hardened with the solvent being removed therefrom, and thereafter, a xylene solution of semiconductor material fluorenebithiophene spin coated thereon to form a semiconductor layer 26. Subsequently, an isopropyl alcohol solution of polyimide (insulating material) is applied spin coated thereon to a form an insulating layer 28. Finally, the fluid used for forming the source electrode 22 and the drain electrode 24 is once again to form the gate electrode 30 on the insulating layer 28.

Thus, an organic TFT having a complicated structure can be readily produced with the pattern-forming method of the invention using only the infrared laser irradiation and ink-jet devices.

According to the pattern-forming method of the invention, a complicated circuit structure such as TFT can be formed by selecting functional components used for the fluid. Therefore, a wide range of applications is to be expected.

Further, when a transparent film such as PET is used for the support, it can be used as a transparent conductive film having a pattern formed thereon. Transparent conductive films have such applications as transparent electrodes for displays, light-adjusting devices, solar batteries, touch panels, and for other transparent conductive films.

The aforementioned conductive particles can be used not only alone, but also in a combination of two or more. Further, a plurality of materials may be previously mixed and used in order to obtain the desired conductive property.

The amount of conductive particles used can be appropriately determined depending on the pattern-forming mechanism for a conductive pattern-forming material. As, due to ionic adsorption, the conductive particles are primarily introduced into the hydrophilic surface in the state of a mono-molecular film, compared with the amount of conductive material used for a general conductive pattern-forming material, the conductive material of the invention exhibits satisfactory conductive property in small amounts. Further, a conductive region having a high sharpness applicable to fine circuits can be formed.

A conductive pattern material according to another aspect of the present invention is characterized in that a conductive polymer layer, which is adsorbed on a hydrophilic functional group of the hydrophilic polymer, is provided on a support. This conductive polymer layer has conductive properties.

For the conductive polymer used in the present invention, any high molecular compound having a conductivity of $10^{-6} s \cdot cm^{-1}$ or more, preferably $10^{-1} s \cdot cm^{-1}$ or more can be used. Specific examples thereof include substituted or non-substituted conductive polyaniline, polyparaphenylene, polyparaphenylenevinylene, polythiophene, polyfuran, polypyrrole, polyselenophene, polyisothianaphthene, polyphenylenesulfide, polyacetylene, polypyridylvinylene, and polyazine. These compounds may be used alone or may be used in a combination of two or more according to purposes. Further, so long as a desired conductivity can be obtained, a mixture containing other polymers having no conductivity may be used, and copylymers comprised of these monomers and other monomers having no conductivity may also be used.

A method for forming a conductive polymer layer using the aforementioned conductive polymer is not particularly limited. From the standpoint of allowing formation of a uniform thin film, a method using a conductive monomer, described below, is preferably used.

First, a support having a hydrophilic surface in which a hydrophilic graft polymer chain exists is immersed in a solution containing a compound which is a polymerization catalyst such as potassium persulfate or iron sulfate (III), or a polymerization initiator. Then, a monomer capable of forming a conductive polymer, such as 3,4-ethylenedioxythiophene is gradually dropped into the solution while being stirred. As a result, a hydrophilic functional group of the graft polymer chain and a monomer capable of forming a conductive polymer strongly adhere by adsorption to each other due to an interaction therebetween, and a polymerization reaction among monomers is accelerated. An extremely thin film of a conductive polymer is formed on a hydrophilic surface in which the hydrophilic graft polymer chain exists, and this film forms a conductive polymer layer.

According to another aspect of the present invention, metallic thin film is formed by the following methods.

Formation of Metallic Thin Film:

A pattern of a hydrophilic region is formed by the methods described in the above, and thereafter, a metal ion or a metallic salt is applied to the hydrophilic region, and the metal ion or a metal ion in the metallic salt is reduced to form a metallic thin film.

A method for applying a metal ion or a metallic salt can be appropriately selected depending on a hydrophilic compound which forms the hydrophilic region. Specifically, any one of the following methods (1) to (3) can be appropriately selected and used.

(1) A method in which, when a hydrophilic compound which forms a hydrophilic region has an acidic group, a metal ion is made to adhere by adsorption to the hydrophilic region;

(2) a method in which, when a hydrophilic compound which forms a hydrophilic region has a high affinity to metallic salt like polyvinylpyrrolidone, the hydrophilic region is impregnated with metallic salt or a solution containing a metallic salt; and (3) a method in which a hydrophilic region is immersed in a solution containing metallic salt or a solution with a metallic salt dissolved therein, so that the hydrophilic region is impregnated with a solution containing a metal ion and/or a metallic salt. Particularly, the method (3) does not depend on the property of the hydrophilic compound, and therefore, a desired metal ion or a metallic salt can be applied.

Metal Ion and Metallic Salt:

Next, a description will be given of a metal ion and metallic salt.

The metallic salt used in the present invention is not particularly limited so long as it may be dissolved in an appropriate solvent so as to be applied to a hydrophilic surface and may be dissociated into a metal ion and a base (an anion). For example, $M(NO_3)_n$, $MCl_n$, $M_{2/n}(SO_4)$, and $M_{3/n}(PO_4)$ (M represents a n-valent metal atom) are used. For the metal ion, any metal ion into the aforementioned metallic salt is dissociated can suitably used. Specific examples thereof include Ag, Cu, Al, Ni, Co, Fe and Pd. In preparation of a conductive film, a magnetic film and a hydrogen permeable film, preferably, Ag, Co and Pd are respectively used.

Reducing Agent:

A reducing agent, which is used in the present invention to reduce a metallic salt or a metallic ion existing by adsorption to or impregnation in a hydrophilic region to form a metallic thin film, is not particularly limited so long as it has the physical property of reducing a used metallic salt compound and allowing deposition of metal. For example, hypophosphite, sodium tetrahydroborate and hydrazine are used.

These reducing agents can be appropriately selected depending on a metallic salt and a metal ion used therein. For example, when an aqueous solution of silver nitrate is used as an aqueous solution of metallic salt used to supply a metal ion and metallic salt, sodium tetrahydroborate is suitably used. Further, when an aqueous solution of palladium dichloride is used, hydrazine is suitably used.

The aforementioned method can be used for the formation of various circuits, and a nano-scale conductive region can be formed from a selected pattern-forming means for a wide range of applications including that of micro-machines, super LSIs, and other circuit structures.

Further, when a transparent film such as PET is used for the support, it can be used as a transparent conductive film having a pattern formed thereon. Such transparent conductive films have applications that include those for transparent electrodes for displays, light-adjusting devices, solar batteries, touch panels and for other transparent conductive films. Particularly, such films are efficiently used as an electromagnetic-wave shield filter attached to a CRT or a plasma display. An electromagnetic-wave shield filter requires high conductivity and transparency, and therefore, the conductive material layer is preferably provided in grid form. The width of the grid line is preferably in the range of 20 to 100 $\mu$m, and the size of the grid squares is preferably in the range of 50 to 600 $\mu$m. The grid-like structure does not need to be formed regularly and by straight lines. It may be formed by curved lines. In the invention, a conductive material layer having such an arbitrary pattern is easily formed, and therefore, various settings according to purpose are possible.

EXAMPLES

The present invention will now be described in greater detail with reference to Examples, but it should be understood that the present invention is not restricted to them.

Example 1

Preparation of Conductive Pattern-forming Material:

On the surface of a polyethylene terephthalate film support having a thickness of 188 $\mu$m and subjected to corona treatment, a coating liquid having the following composition was applied by a coating bar (rod #10), and dried at 100° C. for one minute, to prepare an intermediate layer containing an infrared ray absorber having a thickness of 1.6 $\mu$m.

Coating Liquid for Intermediate Layer:

| | |
|---|---|
| epoxy resin (Epicoat manufactured by Yuka-Shell Co., Ltd.) | 2 g |
| infrared ray absorber (IR125, Wako Pure Chemical) | 0.2 g |
| 1-methoxy-2-propanol | 9 g |
| methyl ethyl ketone | 9 g |

The support surface on which the intermediate layer was formed was subjected to plasma treatment under the following conditions, and a pattern-forming layer was formed by surface graft polymerization.

The support surface was subjected to plasma treatment using a plasma treatment device (LCVD-01 type manufactured by Shimazu Seisakusho) for 10 seconds in an argon gas atmosphere of 0.04 toor. Thereafter, it was exposed to the air, and a peroxide group was introduced. The obtained film was immersed in an aqueous solution having 10 wt % of α (styrene-4-sulfonyl) sodium acetate salt. Argon gas was made to bubble for 15 minutes, and after, the film was heated to 60° C. for 7 hours, graft polymerization was carried out. After the graft polymerization, the film was immersed in 3000 ml of ion-exchange water to remove homopolymers not subjected to graft polymerization. As a result, a conductive pattern-forming material A was obtained with a grafted pattern-forming layer being formed on the surface thereof due to plasma treatment.

Pattern Formation:

The obtained conductive pattern-forming material A was exposed imagewise by an infrared laser (beam diameter: 20 μm) which emits infrared light at a wavelength of 830 nm.

In the present example, positive charge Ag grains prepared in the manner described below, were used as the conductive particles.

3 g of bis(1,1-trimethylammonium decanoylaminoethyl) disulfide was added to 50 ml of ethanol solution of silver perchlorate (5 mM), and 30 ml of sodium borohydride solution (0.4M) was slowly let fall into drops while strongly stirred to thereby reduce ions. As a result, a dispersing liquid of silver grains covered with quaternary ammonium was obtained. An electron microscope measured the average size of the silver grains of 5 nm.

After exposure, the conductive pattern-forming material A was immersed in the obtained positive charge Ag dispersing liquid, and thereafter, the surface thereof was sufficiently rinsed with flowing water to remove excess dispersing liquid.

The surface of the conductive pattern-forming material A to which conductive fine grains are adsorbed was observed by a transmission electron microscope (JEOL JEM-200CX) at 100000 magnifications. As a result, it was recognized from the fine irregularities on whatever surface that Ag fine grains adsorbed only to exposed regions.

Evaluation of Transparent Conductive Circuit:

The surface conductivity of the obtained pattern portion of Ag fine grains was measured to be 1 Ω/□ by a four probe method using LORESTA-FP (manufactured by Mitsubishi Chemical Corp.). Further, the transmittance of the entire film surface having a pattern formed thereon was measured to be 58%. It can be seen therefrom that a conductive pattern having high transparency and excellent conductivity was formed.

Evaluation of Wear Resistance:

The surface of the conductive pattern-forming material A was manually rubbed using a cloth moistened with water (BEMCOT manufactured by Asahi Chemical Industry Co., Ltd.) 30 times over. Thereafter, the rubbed surface was observed by a transmission electron microscope (JEOL JEM-200CX) at 100000 magnifications in the same way as described above. It was recognized that the fine irregularities remained the same as before the rubbing and were not damaged.

Example 2

Preparation of Conductive Pattern-Forming Material:

A biaxial-oriented polyethylene terephthalate film (A4100 manufactured by Toyobo Co., Ltd.) having a thickness of 188 μm and subjected to corona treatment was subjected to oxygen glowing using a planographic magnetron sputtering device (CFS-10-EP70 manufactured by Shibaura Eletec) under predetermined conditions: initial vacuum $8\times10^8$ Pa ($9\times10^6$ toor); oxygen pressure $9.1\times10^5$ Pa ($6.8\times10^3$ toor); RF glow 1.5 kw; and processing time 60 seconds.

Subsequently, a methyl ethyl ketone solution (50 wt %) of the following exemplified monomer (M-3) was applied onto the glowing subjected film, and dried at 100° C. for one minute and irradiated with UV light (a 400-W high-pressure mercury lamp for 30 minutes) to carry out graft polymerization and form a graft layer. Further, 5% by weight of acetonitrile solution of a light-to-heat conversion dye (IR-A) (structure described below) was applied using a rod bar #7 to allow inclusion of the dye in the graft layer. As a result, a conductive pattern-forming material B was obtained.

Pattern Formation:

Conductive pattern-forming material B was exposed imagewise to an infrared laser (beam diameter: 20 μm) which emits infrared light having a wavelength of 830 nm.

After exposure, the material B was immersed in the same positive charge Ag dispersing liquid as that in Example 1, and thereafter, the surface thereof was sufficiently rinsed with flowing water to remove excess dispersing liquid.

The surface of the material B was observed by a transmission electron microscope (JEOL JEM-200CX) at 100000 magnifications. As a result, it was recognized from the fine irregularities formed on whether surface that Ag fine grains adsorbed only to exposed regions.

The material B was evaluated in the same manner as in Example 1. The surface resistance value thereof was 0.8 Ω/□, and excellent conductivity and wear resistance was obtained.

Example 3

Preparation of Hydrophilic Pattern:

The polyethylene terephthalate film subjected to the corona treatment in Example 2, and further subjected to glowing under the same conditions as those of Example 2, was used as a substrate for a support.

The film was coated with acrylic acid using a rod bar #6 and a coating surface was laminated with a PET film having a thickness of 25 μ. Subsequently, a chromium-deposit mask pattern was placed thereon and irradiated with UV light (a 400-W high-pressure mercury lamp: UVL-400P manufactured by Riko Kagaku Sangyo, irradiation time: 30 seconds). After irradiation with light, the mask and the laminated film were removed and the substrate surface was rinsed with water. As a result, a hydrophilic pattern 3 having polyacrylate grafted in a patterned manner was obtained.

Formation of Conductive Material Layer:

3 g of bis(1,1-trimethylammonium decanoylaminoethyl) disulfide was added to 50 ml of ethanol solution of silver perchlorate (5 mM), and 30 ml of sodium borohydride solution (0.4M) was slowly distilled while vigorously stirred to thereby reduce ions. As a result, a dispersing liquid of silver grains coated with quaternary ammonium was obtained. An electron microscope measured the average size of the silver grains at 5 nm.

The hydrophilic pattern 3 was immersed in the dispersing liquid of positive charge Ag, and thereafter, the surface thereof was sufficiently rinsed with flowing water to remove excess dispersing liquid. The surface of the hydrophilic pattern 3 was observed by an optical microscope at 300 magnifications. As a result, the distinct formation of a conductive pattern material 3 was revealed.

Evaluation of Conductive Pattern Material:

1. Conductivity

The surface resistance value of the obtained conductive pattern material 3 was measured by a four probe method using LORESTA-FP (manufactured by Mitsubishi Chemical Corp.). The surface resistance value was 100Ω/□. Excellent conductivity was obtained.

2. Pencil Hardness

The coating strength of the surface of the material 3 was measured in accordance with the hardness measurement method defined by JIS G0202. The pencil hardness was 4H or more. The higher the pencil hardness used in the hardness test (the value H becomes higher from 1H to 4H), the more excellent the strength. It can be seen from the evaluation result that excellent coating strength and scratch resistance was obtained.

Example 4
Preparation of Hydrophilic Pattern:

The same polyethylene terephthalate film as that used in Example 3 was coated using a rod bar #17 with the following composition for forming a layer (a polymeric layer) which exhibits polymerization initiating ability, and dried at 80° C. for 2 minutes. Subsequently, the film thus coated was irradiated with UV light (a 400-W high pressure mercury lamp, irradiation time: 10 minutes) and preliminarily hardened.

| | |
|---|---|
| allylmethacrylate/methacrylate copolymer (mole fraction: 80/20, molecular weight: 100000) | 4 g |
| ethyleneoxide-denatured bisphenol A diacrylate (M210 manufactured by Toagosei Co., Ltd.) | 4 g |
| 1-hydoxycyclohexylphenylketone | 1.6 g |
| 1-methoxy-2-propanol | 16 g |

The support surface was coated with an aqueous solution of styrene sodium sulfonate (30 wt %) using a rod bar #12, and laminated with a PET film (25 μ) without drying. Subsequently, a chromium-deposit mask pattern was placed thereon and irradiated with UV light (a 400-W high pressure mercury lamp, irradiation time: 10 minutes). After irradiation with light, the mask and the laminated film were removed and the support surface was rinsed with water. As a result, a hydrophilic pattern 4 was obtained with polystyrene sodium sulfonate grafted on a patterned manner.
Formation of Conductive Material Layer:

A conductive pattern material 4 was prepared by forming a conductive material layer on the obtained hydrophilic pattern 4 in the same manner as in Example 3.

The surface resistance value of the material 4 was measured in the same manner as in Example 3. The surface resistance value was 50Ω/□. Excellent conductivity was obtained.

Further, the pencil hardness was measured in the same manner as in Example 3, and the pencil hardness was 4H or more. Excellent surface coating was obtained.

Example 5
Preparation of Conductive Pattern-Forming Material:

A polyethylene terephthalate film (A4100 manufactured by Toyobo Co., Ltd.) having a thickness of 188 μm and subjected to corona treatment was used as the support. It was subjected to argon glowing using a planographic magnetron sputtering device (CFS-10 -EP70 manufactured by Toshiba Eletec) under predetermined conditions: initial vacuum 1.2× $10^{-3}$ Pa; argon pressure 0.9 Pa; RF glow 1.5 kW; and processing time 60 seconds.

The film was immersed in a nitrogen bubbling methyl ethyl ketone solution (10%) of 1-ethoxyethylacrylate (A-EE manufactured by Nakamura Kagaku) at 50° C. for 7 hours for the purpose of graft polymerization. Subsequently, the film thus obtained was immersed in and rinsed with acetone for 8 hours to remove non-grafted polymer, thereby providing a high molecular compound-containing layer in which 2-ethoxyethylacrylate was graft-polymerized on the surface thereof.

Further, the obtained layer was immersed in 10 wt % of methyl ethyl ketone solution of 2,6-bistrichloromethyl-4-(p-(N,N-di(ethoxycarbonylmethyl)amino)phenyl)-triazine for 5 minutes to prepare a substrate.

Two sheets of substrates prepared in such a manner as described above were exposed using an InGaN based semiconductor laser (oscillation wavelength: 400 nm) so as to allow formation of straight lines under predetermined conditions: the beam diameter on the surface thereof 40 μm; and exposure energy density 0.2 mJ/cm².

In order to confirm polarity conversion between the hydrophilic property and the hydrophobic property, one of the substrates was immersed in water for 5 seconds, and thereafter taken out and squeezed slightly by a rubber plate. As shown in FIG. 1, it was confirmed as a result that only the portion exposed linearly to the laser beam was made hydrophilic so that water linearly adhered to it. No water adhered to the unexposed portion, and the spreading of water drops stopped at the boundary between the exposed portion and the unexposed portion.

A test for forming an electrode on another substrate was conducted. This substrate was also exposed linearly to a laser in the same manner as in the aforementioned test for the confirmation of the hydrophilic property. A polyethyleneoxythiophene solution made to fly at a grain size of 15 μm was discharged by an ink jet device to the linear exposed portion at intervals of 30 μm to thereby form a fluid.

In the conductive region to which the polyethylenedioxythiophene was adsorbed, the conductivity for each end of ten lines having a length of 2 mm was carefully measured using a tester together with a microscope. As a result, all lines were found to have a conductivity of 1 Ω or less.

Linear unexposed portions existed between linear conductive portions formed in the exposed region, but it was confirmed from microscopic observation that partition effects prevented the spreading and adhesion of polyethyleneoxythiophene to the unexposed portions. Moreover, the conductivity of the unexposed region was measured using the tester described above, and it was confirmed that this region existed as an insulating region with no conductivity.

Example 6

A polyimide (a copolymer of pyromellitate anhydride·m-phenylenediamine) film having a thickness of 200 μm and subjected to corona treatment was used as the support. It was coated with the composition described below with a coating bar (wire rod #10), and dried at 100° C. for one minute. As a result, an intermediate layer having a film thickness of 1.6 μm and containing an infrared absorber was prepared.
Intermediate-Layer Coating Liquid:

| | |
|---|---|
| epoxy resin (Epicoat, Yuka-shell Co., Ltd.) | 2 g |
| infrared absorber (IR125, Wako Pure Chemical) | 0.2 g |
| 1-methoxy-2-propanol | 9 g |
| methyl ethyl ketone | 9 g |

The support surface formed on the intermediate layer was subjected to plasma treatment under the following conditions and a high molecular compound-containing layer was formed by surface graft polymerization.

The support surface was subjected to plasma treatment using a LCVD-01 type plasma treatment device manufactured by Shimazu Seisakusho for 10 seconds in an argon gas atmosphere of 0.04 toor. Thereafter, it was exposed to the air, and a peroxide group was introduced. The obtained film was immersed in an aqueous solution having 10 wt % of α (styrene-4-sulfonyl)sodium acetate salt and after the argon gas was made to bubble for 15 minutes, it was subjected to graft polymerization by being heated to 60° C. for 7 hours. After the graft polymerization, the film was immersed in 3000 ml of ion-exchange water to remove non-graft homopolymer. As a result, a plasma treated substrate in which a high molecular compound-containing layer is grafted on the surface thereof was obtained.

Two substrates were prepared in such a manner as described above and were each exposed in a way to allow the formation of straight lines to an infrared laser (beam diameter: 45 µm) which emits infrared light having a wavelength of 830 nm.

In order to confirm polarity conversion between the hydrophilic property and the hydrophobic property, one of the substrates was immersed in water for 5 seconds and thereafter, taken out therefrom and squeezed slightly by a rubber plate. As a result, the portion exposed to the laser beam was made hydrophobic and no water adhered to it. Further, it was confirmed that water adhered only to the unexposed portion having a hydrophilic surface and that the spreading of the water drops stopped at the boundary between the exposed portion and the unexposed portion.

A test for forming an electrode on another substrate was conducted. This substrate was also exposed linearly to a laser in the same manner as in the aforementioned test. A polyethyleneoxythiophene solution made to fly at a grain size of 15 µm was discharged by an ink jet device to the linear exposed portion at intervals of 30 µm to thereby form a fluid.

In the conductive region to which the polyethylenedioxythiophene was adsorbed, the conductivity for each end of ten lines having a length of 2 mm was carefully measured using a tester together with a microscope. As a result, all lines were found to have a conductivity of 1Ω or less.

Linear exposed portions existed between linear conductive portions formed in the unexposed region, but it was confirmed from microscopic observation that partition effects prevented the spreading and adhesion of polyethyleneoxythiophene to the exposed portions. Moreover, the conductivity of the exposed region was measured using the tester described above, and it was confirmed that this region existed as an insulating region with no conductivity.

Example 7

Two substrates having the same high molecular compound-containing layer as was used in Example 5 were used. These substrates were each covered with a printing film having a pattern in which straight lines having a width of 50 µm are arranged parallel to each other at intervals of 50 µm. There were also covered with a flat transparent quartz glass plate as an additional layering, and thereafter, from an upper position of 30 cm distant, exposed to a 200-W high-pressure mercury lamp for 30 seconds.

In order to confirm polarity conversion between the hydrophilic property and the hydrophobic property, one of the substrates was immersed in water for 5 seconds, and thereafter, taken out and squeezed slightly by a rubber plate. As a result, the portion exposed to the laser beam was made hydrophilic and water adhered only to it. Further, it was confirmed that no water adhered to the unexposed portion having the hydrophobic surface and that the spreading of the water drops stopped at the boundary between the exposed portion and the unexposed portion.

A test for forming an electrode on another substrate was conducted.

A conductive jet-printing ink having no affinity with water and having the composition described below, was discharged by an ink-jet device in the grain size of 15 µm to the linear unexposed region of the exposed substrate at intervals of 30 µm to thereby form a fluid.

Jet-Printing Conductive Ink

| | |
|---|---|
| acrylic polymer (40 wt %: toluene solution) | 10 g |
| aluminum powder | 4 g |
| conductive carbon black powder | 0.5 g |
| xylene | 80 g |

In the conductive region to which the conductive ink was adsorbed, the conductivity for each end of ten lines having a length of 1 mm was carefully measured using a tester together with a microscope. As a result, all lines were found to have a conductivity of 1 Ω or less.

Further, linear exposed portions existed between linear conductive portions formed in the unexposed region, but it was confirmed from microscopic observation that partition effects prevented the spreading and adhesion of the jet-printing conductive ink to the exposed portions. Moreover, the conductivity of the exposed region was measured using the tester described above, and it was confirmed that this region existed as an insulating region with no conductivity.

As a result, it was confirmed that the same effects of usage are exhibited not only for the organic conductive material, but also for the conductive ink containing conductive particles dispersed therein.

A source electrode and a drain electrode were formed in separation by the highly-accurate and stable conductive pattern obtained in Examples 5, 6, and 7. A high-molecular liquid crystal layer (provided at the position corresponding to the semiconductor layer 26 in FIG. 2) is formed by spin coating over the source and drain electrodes formed on the substrate. Subsequently, polyvinylpyrolidone (PVP) is applied thereon by a spin coater to form the insulating layer, and the fluid (the conductive material used in Examples 5, 6, and 7) is adhered to the uppermost layer by inkjet to form a gate electrode. Thus, a thin-film liquid crystal panel could easily be prepared.

The conductive pattern-forming material of the invention has the excellent effects of allowing the formation of a high-resolution fine pattern at high sensitivity due to exposure or heating with no wire breakage, and the formation of circuits directly on the base material based on the digital data from the operation of an infrared laser. A wide range of applications, including those for electromagnetic-wave shield filters is to be expected. Further, the conductive pattern-forming method of the invention allows the formation of a high-resolution fine conductive pattern on a substrate.

According to the pattern-forming method of the invention, it is possible to form a pattern at a high sensitivity due to exposure or heating without any complicated processes or expensive apparatus. Even when this method is applied to the formation of wiring using different materials, a high-resolution fine pattern can be obtained, and a pattern can be directly formed on the base material based on digital data from the operation of an infrared laser or the like. Therefore, a wide range of applications is to be expected.

Example 8

Preparation of Hydrophilic Pattern:

A biaxial-oriented polyethylene terephthalate film (A4100 manufactured by Toyobo Co., Ltd.) having a thickness of 188 µm and subjected to corona treatment was subjected to oxygen glowing using a planographic magnetron sputtering device (CFS-10-EP70 manufactured by Shibaura Eletec) under predetermined conditions: initial vacuum $1.2 \times 10^{-3}$ Pa; oxygen pressure 0.9 Pa; RF glow 1.5 kw; and processing time 60 seconds.

The film subjected to the glowing was coated with acrylic acid using a rod bar #6 and a coating surface was laminated with a PET film having a thickness of 25 $\mu$. Subsequently, a chromium-vapour-deposited mask pattern was placed thereon and irradiated with UV light (a 400-W high-pressure mercury lamp: UVL-400P manufactured by Riko Kagaku Sangyo, irradiation time: 30 seconds). After irradiation with light, the mask and the laminated film were removed and the substrate surface was rinsed with water. As a result, a hydrophilic pattern 1 having polyacrylate grafted in a patterned manner was obtained.

Formation of Conductive Polymer Layer:

A support having the hydrophilic pattern 1 was immersed in a solution having 1.23 g of anthraquinone-2-sodium sulfonate monohydrate, 7.20 g of 5-sodium sulfosalicylic acid hydrate, and 4.38 g of iron trichloride hexahydrate dissolved in 125 ml of water, and a solution containing 0.75 ml of pyrrole and 125 ml of water was added thereto while being stirred. After one hour, the support was taken out from the solution and rinsed with water and subsequently rinsed with acetone, thereby obtaining a conductive pattern material 1 of Example 8 having a polypyrrole layer (conductive polymer) formed on the surface of the support.

Evaluation of Conductive Pattern Material:

Conductivity

The surface resistance value of the obtained conductive pattern material 1 was measured by a four-probe method using LORESTA-FP (manufactured by Mitsubishi Chemical Corp.). The surface resistance value was 1000 $\Omega/\square$. The lower the surface resistance value, the more excellent the conductivity.

Example 9

Preparation of Conductive Pattern Material:

On a surface of a polyethylene terephthalate film support (M4100 manufactured by Toyobo Co., Ltd.) having a thickness of 0.188 mm and subjected to corona treatment, a coating liquid having the following composition was applied by a coating bar (rod #10), and dried at 100° C. for one minute, to prepare an intermediate layer containing an infrared ray absorber having a thickness of 1.6 $\mu$m.

Coating Liquid for Intermediate Layer:

| | |
|---|---|
| epoxy resin (Epicoat manufactured by Yuka-Shell Co., Ltd.) | 2 g |
| infrared ray absorber (IR125, Wako Pure Chemical) | 0.2 g |
| 1-methoxy-2-propanol | 9 g |
| methyl ethyl ketone | 9 g |

The support surface on which the intermediate layer was formed was subjected to plasma treatment under the following conditions, and a pattern-forming layer was formed by surface graft polymerization.

The support surface was subjected to plasma treatment using a plasma treatment device (LCVD-01 type manufactured by Shimazu Seisakusho) for 10 seconds in an argon gas atmosphere of 5.33 Pa (0.04 torr). Thereafter, it was exposed to the air, and a peroxide group was introduced into the surface of the intermediate layer. The obtained film was immersed in an aqueous solution having 10 wt % of α(styrene-4-sulfonyl)sodium acetate salt. Argon gas was bubbled into the solution for 15 minutes, and thereafter, the film was heated to 60° C. for 7 hours to carry out graft polymerization. After the graft polymerization, the film was immersed in 3000 ml of ion-exchange water to remove homopolymers not used for graft polymerization. As a result, a pattern-forming material A was obtained with a grafted pattern-forming layer being formed on the surface thereof due to plasma treatment.

Pattern Formation:

The obtained pattern-forming material A was exposed imagewise by an infrared laser (beam diameter: 20 $\mu$m) which emits infrared light at a wavelength of 830 nm.

Formation of Metallic Thin Film:

The pattern-forming material A having a pattern comprised of a hydrophilic/hydrophobic region formed by exposure was immersed in an aqueous solution containing a 15% by mass of silver nitrate (Wako Pure Chemical) for 12 hours, and thereafter, rinsed with distilled water. Subsequently, the pattern-forming material A was immersed in 100 ml of distilled water, and 30 ml of 0.2 M sodium tetrahydroborate was dropped in the distilled water to reduce a silver ion, thereby forming a homogeneous Ag metallic film (metallic thin film) on the surface of the pattern-forming material A. The thickness of the formed Ag metallic film was 0.1 $\mu$m. As a result, a conductive pattern material A with the Ag metallic film formed thereon was obtained.

Evaluation of Conductivity:

The surface conductivity in a pattern portion of the obtained Ag metallic film was measured by a four probe method using LORESTA-FP (manufactured by Mitsubishi Chemical Corp.). The surface conductivity was $1.0 \times 100 \Omega/\square$. Excellent conductivity was obtained.

Evaluation of Metallic Thin Film:

Film Strength (Adhesiveness)

The film adhesiveness of the conductive pattern material A with Ag metallic film formed thereon was evaluated using a cross-cut adhesion test in accordance with JIS 5400. A tape peeling test was carried out for a cut cross and no peeling was found. As a result, it was recognized that the adhesiveness thereof to a substrate was excellent.

What is claimed is:

1. A conductive pattern material formed by providing a pattern-forming material having, on a support surface, a pattern-forming layer which allows formation of a hydrophilic/hydrophobic region directly bonded to the support surface due to energy imparted, and imparting energy to the pattern-forming material in an imagewise manner to allow the hydrophilic/hydrophobic region to be formed on the surface of the pattern-forming material, and thereafter, forming a conductive material layer on the imagewise hydrophilic/hydrophobic region.

2. The conductive pattern material of claim 1, wherein the pattern-forming material includes, on the support, a high molecular compound-containing layer in which a high molecular compound having a functional group which changes from a hydrophobic property to a hydrophilic property due to heat, an acid, or radiation, is directly bonded to the support surface.

3. The conductive pattern material of claim 2, wherein a conductive material for forming the conductive material layer comprises conductive particles.

4. The conductive pattern material of claim 1, wherein the pattern-forming material includes, on the support, a high molecular compound-containing layer in which a high molecular compound having a functional group which changes from a hydrophilic property to a hydrophobic property due to heat, an acid, or radiation, is directly bonded to the support surface.

5. The conductive pattern material of claim 4, wherein a conductive material for forming the conductive material layer comprises conductive particles.

6. The conductive pattern material of claim 1, wherein the pattern-forming material is used to form a hydrophilic pattern in such a manner that a hydrophilic compound having a polymeric group is made to contact the support, and is directly bonded to the support surface due to imagewise irradiation of radiation.

7. The conductive pattern material of claim 6, wherein a conductive material for forming the conductive material layer comprises conductive particles.

8. The conductive pattern material of claim 1, wherein a conductive material for forming the conductive material layer comprises conductive particles.

9. A conductive pattern material formed by forming a hydrophilic pattern on a support so as to be directly bonded to a surface of the support, and forming a conductive polymer layer on the hydrophilic pattern.

10. The conductive pattern material of claim 9, wherein the conductive polymer layer comprises a conductive polymer that is a high molecular compound having a conductivity of $10^{-6}$ s·cm$^{-1}$ or more.

11. The conductive pattern material of claim 9, wherein the conductive polymer layer comprises at least one conductive polymer selected from the group consisting of substituted or non-substituted conductive polyaniline, polyparaphenylene, polyparaphenylenevinylene, polythiophene, polyfuran, polypyrrole, polyselenophene, polyisothianaphthene, polyphenylenesulfide, polyacetylene, polypyridylvinylene, and polyazine.

12. A conductive pattern material formed by forming a pattern comprised of a hydrophilic/hydrophobic region on a surface of a substrate, and thereafter, applying a metal ion or a metallic salt to a hydrophilic region, and reducing the metal ion or a metal ion in the metallic salt to form a metallic thin film.

* * * * *